US011411092B2

(12) United States Patent
Bao et al.

(10) Patent No.: US 11,411,092 B2
(45) Date of Patent: Aug. 9, 2022

(54) FIELD EFFECT TRANSISTOR (FET) COMPRISING INNER SPACERS AND VOIDS BETWEEN CHANNELS

(71) Applicant: QUALCOMM Incorporated, San Diego, CA (US)

(72) Inventors: Junjing Bao, San Diego, CA (US); Ye Lu, San Diego, CA (US); Peijie Feng, San Diego, CA (US); Chenjie Tang, San Diego, CA (US)

( * ) Notice: Subject to any disclaimer, the term of this patent is extended or adjusted under 35 U.S.C. 154(b) by 0 days.

(21) Appl. No.: 16/868,376

(22) Filed: May 6, 2020

(65) Prior Publication Data

US 2021/0351276 A1 Nov. 11, 2021

(51) Int. Cl.
H01L 29/06 (2006.01)
H01L 29/66 (2006.01)
H01L 29/78 (2006.01)
H01L 29/786 (2006.01)
H01L 29/49 (2006.01)
H01L 27/092 (2006.01)
H01L 29/423 (2006.01)
H01L 21/02 (2006.01)
H01L 21/764 (2006.01)

(52) U.S. Cl.
CPC .... *H01L 29/4908* (2013.01); *H01L 21/02532* (2013.01); *H01L 21/02603* (2013.01); *H01L 21/764* (2013.01); *H01L 27/092* (2013.01); *H01L 29/0673* (2013.01); *H01L 29/42392* (2013.01); *H01L 29/4991* (2013.01); *H01L 29/66545* (2013.01); *H01L 29/66553* (2013.01); *H01L 29/66742* (2013.01); *H01L 29/78618* (2013.01); *H01L 29/78696* (2013.01)

(58) Field of Classification Search
CPC .......... H01L 29/42392; H01L 29/0653; H01L 29/66553; H01L 29/78696; H01L 29/775; H01L 29/0673
See application file for complete search history.

(56) References Cited

U.S. PATENT DOCUMENTS

| 9,362,355 | B1 | 6/2016 | Cheng et al. |
| 10,096,688 | B2 | 10/2018 | Tak et al. |
| 2017/0141207 | A1 | 5/2017 | Cheng et al. |
| 2019/0157414 | A1 | 5/2019 | Ando et al. |
| 2019/0305104 | A1 | 10/2019 | Xie et al. |
| 2020/0168708 | A1* | 5/2020 | Radosavljevic ........ H01L 29/06 |
| 2020/0365692 | A1* | 11/2020 | Jung ...................... H01L 29/785 |
| 2021/0036122 | A1* | 2/2021 | Wong .................. H01L 29/0673 |

(Continued)

FOREIGN PATENT DOCUMENTS

WO 2017111974 A1 6/2017

*Primary Examiner* — Brian Turner
(74) *Attorney, Agent, or Firm* — Loza & Loza, LLP/Qualcomm

(57) ABSTRACT

An integrated device that includes a substrate and a first transistor formed over the substrate. The first transistor includes a first source disposed over the substrate, a first drain disposed over the substrate, a first plurality of channels coupled to the first source and the first drain, where the first plurality of channels is located between the first source and the first drain; at least one inner spacer located between two adjacent channels from the first plurality of channels; at least two voids located between the two adjacent channels; and a first gate surrounding the first plurality of channels.

30 Claims, 27 Drawing Sheets

(56) References Cited

U.S. PATENT DOCUMENTS

| | | | |
|---|---|---|---|
| 2021/0043727 A1* | 2/2021 | Frougier | H01L 29/775 |
| 2021/0126106 A1* | 4/2021 | Wang | H01L 29/42392 |
| 2021/0273103 A1* | 9/2021 | Chen | H01L 27/0886 |

* cited by examiner

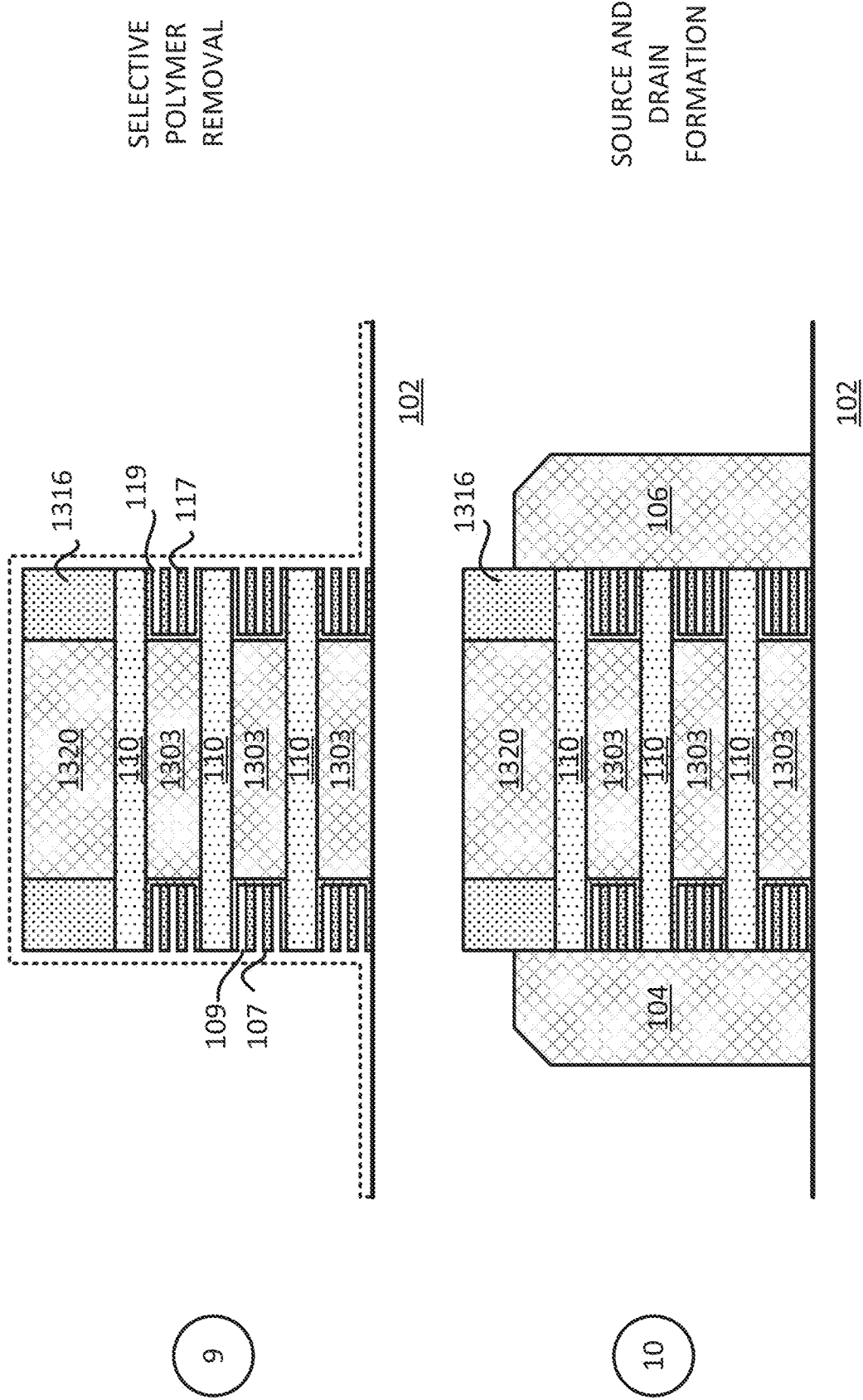

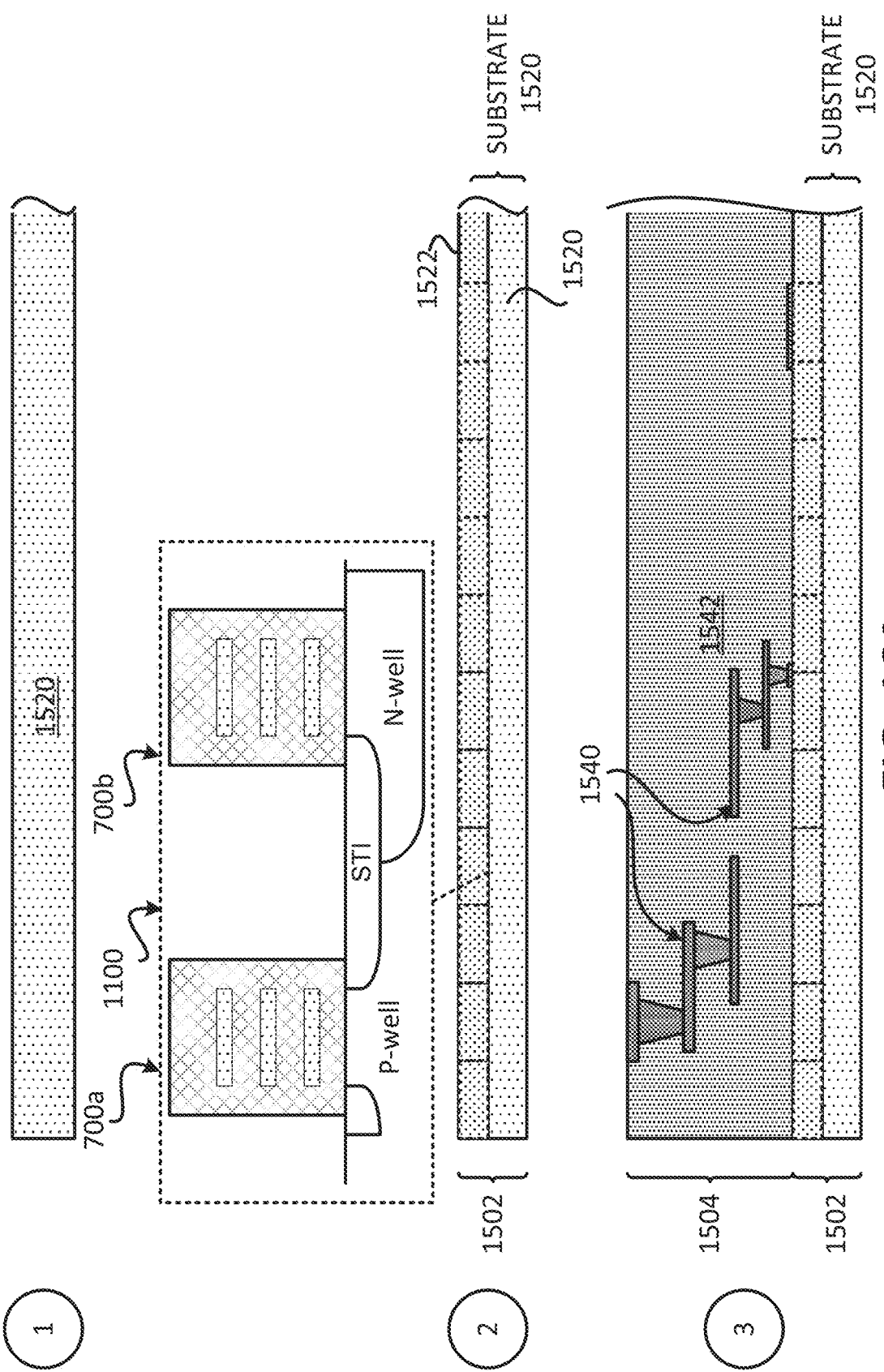

FIELD EFFECT TRANSISTOR (FET) COMPRISING INNER SPACERS AND VOIDS BETWEEN CHANNELS

FIELD

Various features relate to integrated devices, but more specifically to integrated devices comprising field effect transistors (FETs) with inner spacers and voids between channels.

BACKGROUND

An integrated device may include several field effect transistors (FETs). A FET may include a source, a drain and a gate. The source and the drain may be located over a substrate. When a threshold voltage is applied between the gate and the substrate, a current may flow between the source and the drain. There may be strong electrical coupling between the source and the drain, which can cause current to flow between the source and drain, even when there is no voltage applied to the gate and the substrate. This can cause performance and reliability issues for the transistors. There is an ongoing need to improve the performance and/or reliability of transistors.

SUMMARY

Various features relate to integrated devices, but more specifically to integrated devices comprising field effect transistors (FETs) with inner spacers and voids between channels.

One example provides an integrated device comprising a substrate and a first transistor formed over the substrate. The first transistor includes a first source disposed over the substrate, a first drain disposed over the substrate, a first plurality of channels coupled to the first source and the first drain, where the first plurality of channels is located between the first source and the first drain; at least one inner spacer located between two adjacent channels from the first plurality of channels; at least two voids located between the two adjacent channels; and a first gate surrounding the first plurality of channels.

Another example provides an apparatus comprising a substrate and means for first transistor formed over the substrate. The means for first transistor includes means for first source disposed over the substrate; means for first drain disposed over the substrate; means for first channeling coupled to the means for first source and the means for first drain, where the means for first channeling is located between the means for first source and the means for first drain; means for first inner spacing located between two adjacent channels from the means for first channeling; at least two voids located between the two adjacent channels from the means for first channeling; and means for first gate surrounding the means for first channeling.

Another example provides an integrated device comprising a substrate and a first transistor formed over the substrate. The first transistor includes a first source disposed over the substrate, a first drain disposed over the substrate, a first plurality of channels coupled to the first source and the first drain, where the first plurality of channels is located between the first source and the first drain; at least one inner spacer located between a first channel and the substrate, where the first channel is a channel from the first plurality of channels that is closest to the substrate; at least two voids located between the first channel and the substrate; and a first gate surrounding the first plurality of channels.

Another example provides a method for fabricating an integrated device. The method provides a substrate. The method forms a first transistor over the substrate. Forming the first transistor includes forming a first plurality of channels. Forming the first transistor includes forming at least one inner spacer between two adjacent channels from the first plurality of channels such that there are at least two voids between the two adjacent channels from the first plurality of channels. Forming the first transistor includes forming a first source over the substrate. Forming the first transistor includes forming a first drain over the substrate. Forming the first transistor includes forming a first gate surrounding the first plurality of channels.

BRIEF DESCRIPTION OF THE DRAWINGS

Various features, nature and advantages may become apparent from the detailed description set forth below when taken in conjunction with the drawings in which like reference characters identify correspondingly throughout.

FIGS. 13A-13I illustrate an exemplary sequence for fabricating a gate-all-around (GAA) FET.

FIGS. 16A-16B illustrate an exemplary sequence for fabricating an integrated device that includes gate-all-around (GAA) FETs.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes an integrated device that includes a substrate and a first transistor formed over the substrate. The first transistor includes a first source disposed over the substrate, a first drain disposed over the substrate, a first plurality of channels coupled to the first source and the first drain, where the first plurality of channels is located between the first source and the first drain; at least one inner spacer located between two adjacent channels from the first plurality of channels; at least two voids located between two adjacent channels; and a first gate surrounding the first plurality of channels. The first transistor includes a field effect transistor (FET). The first transistor includes a gate all around (GAA) FET. The first transistor may be configured to operate as a negative channel metal oxide semiconductor (NMOS) transistor. The first transistor may be configured to operate as a positive channel metal oxide semiconductor (PMOS) transistor. The transistor described in the disclosure provides improved performance through the use of at least one inner spacer and at least two voids located between two adjacent channels from the first plurality of channels. The at least one inner spacer and at least two voids help reduce the K value of the inner spacers and/or outer spacers. This in turn helps reduce the parasitic capacitance of the inner spacers and/or outer spacers. Moreover, the use at least one inner spacer and at least two voids located between two adjacent channels from the first plurality of channels helps isolate the source and the drain of the transistor.

Figure 1:
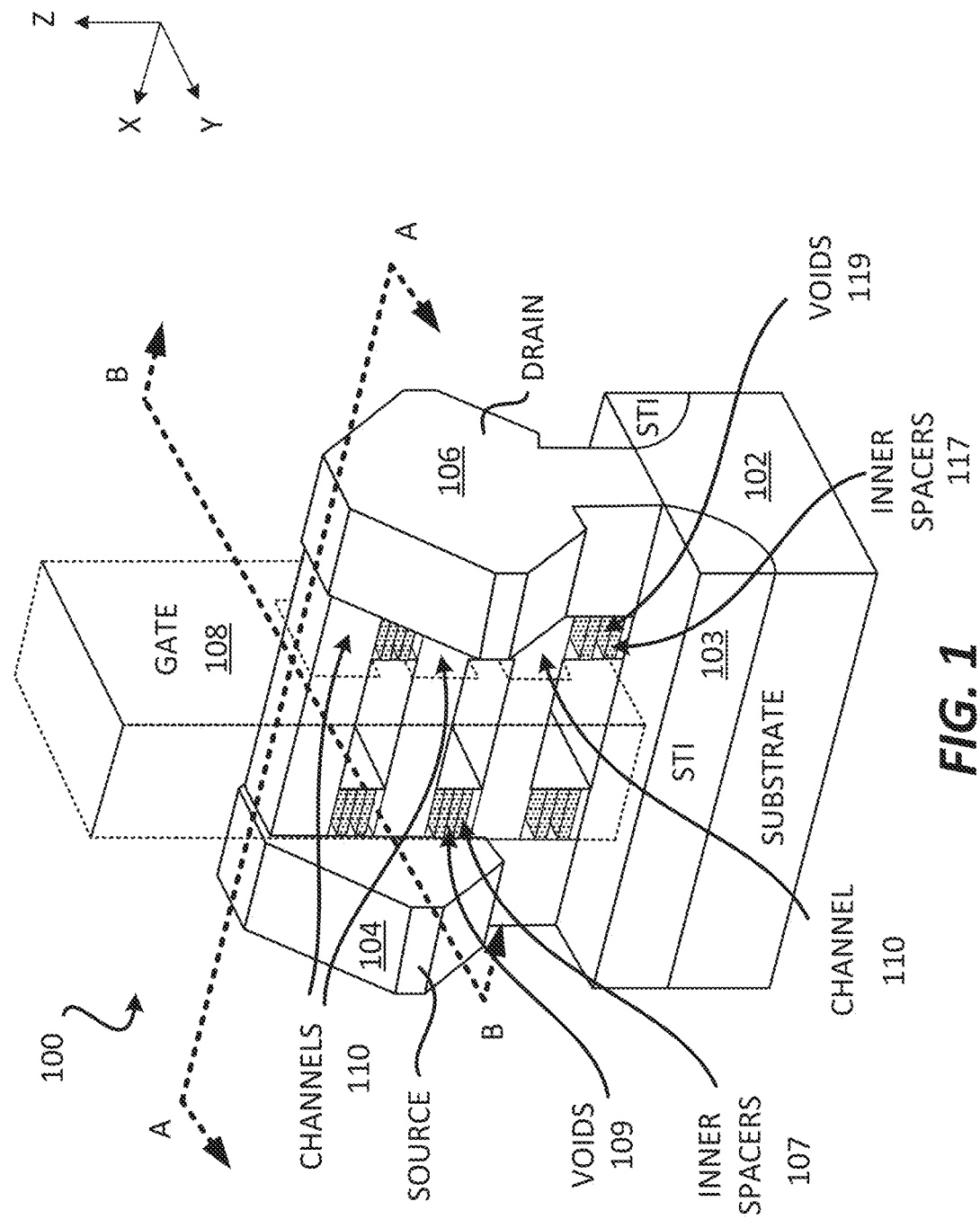
FIG. 1 illustrates an exemplary view of a gate-all-around (GAA) field effect transistor (FET) formed over a substrate.

Exemplary Gate-All-Around Field Effect Transistor (FET) Comprising Inner Spacers and Voids Between Channels FIG. 1 illustrates an example of a transistor 100 that is formed over a substrate. The transistor 100 may include a gate-all-around (GAA) field effect transistor (FET). In particular, the transistor 100 include a multi-channel gate-all-around FET. As will be further described below in detail, the transistor 100 may include several rows of inner spacers and/or several voids (e.g., several rows of voids) between adjacent channels. The several rows of inner spacers and/or voids may help reduce the effective K value of the inner spacers, which may help better isolate the source and the drain from each other.

As shown in FIG. 1, the transistor 100 is formed over the substrate 102. The substrate 102 may include silicon (Si). The transistor 100 (e.g., first transistor, second transistor) includes a source 104 (e.g., first source, second source), a drain 106 (e.g., first drain, second drain), a gate 108 (e.g., first gate, second gate), a plurality of channels 110 (e.g., first plurality of channels, second plurality of channels), a plurality of inner spacers 107, a plurality of inner spacers 117, a plurality of voids 109, and a plurality of voids 119. The transistor 100 may also include at least one control layer (not shown in FIG. 1, but shown and described in other figures). In some implementations, the substrate 102 may be considered part of the transistor 100. The substrate 102 may include one or more shallow trench isolations (STIs) 103. The substrate 102 may be a P substrate or a N substrate. Although not shown, the substrate 102 may include wells, such as a P-well and a N-well.

FIG. 1 illustrates that the source 104 is disposed (e.g., formed, located) over the substrate 102. Similarly, the drain 106 is disposed (e.g., formed, located) over the substrate 102. The plurality of channels 110 is coupled to the source 104 and the drain 106. The plurality of channels 110 is coupled to the source 104 and the drain 106, such that the plurality of channels 110 is located between the source 104 and the drain 106. The plurality of channels 110 is configured to allow a current to flow between the source 104 and the drain 106 when a voltage (Vt) (e.g., threshold voltage) is applied between the gate 108 and the substrate 102. The plurality of channels 110 may include a first channel, a second channel and a third channel. The first channel, the second channel and the third channel may be stacked vertically above one another, with a space (for a gate) between each channel. Different implementations may include a different number of channels 110 (e.g., two or more channels). One or more channels from the plurality of channels 110 may include silicon (Si). The gate 108 is located between the source 104 and the drain 106. The gate 108 is formed such as to wrap around or surround the plurality of channels 110. For example, the gate 108 may surround the four sides of a channel from the plurality of channels 110.

The plurality of inner spacers 107 and the plurality of voids 109 are located between the source 104 and the gate 108. The plurality of inner spacers 107 and the plurality of voids 109 may be located on a source side of the transistor 100. The plurality of inner spacers 107 may include source side inner spacers. The plurality of voids 109 may include source side voids. The plurality of inner spacers 107 and the plurality of voids 109 may be located between the substrate 102 and a channel (from the plurality of channels 110) closest to the substrate 102. For example, alternating inner spacers 107 and voids 109 (e.g., inner voids) may be located between the substrate 102 and a channel (from the plurality of channels 110) closest to the substrate 102. The plurality of inner spacers 107 and the plurality of voids 109 may be located between two adjacent channels from the plurality of channels 110. For example, alternating inner spacers 107 and voids 109 (e.g., inner voids) may be located between two adjacent channels from the plurality of channels 110. In some implementations, the rows of inner spacers 107 may include vertically stacked inner spacers (e.g., vertically stacked layers of inner spacer), and the rows of voids 109 may include vertically stacked voids. In some implementations, two adjacent (e.g., two vertically adjacent) inner spacers from the rows of inners spacers 107 may be separated by at least one void (e.g., 109).

The plurality of inner spacers 117 and the plurality of voids 119 are located between the drain 106 and the gate 108. The plurality of inner spacers 117 and the plurality of voids 119 may be located on a drain side of the transistor 100. The plurality of inner spacers 117 may include drain side inner spacers. The plurality of voids 119 may include drain side voids. The plurality of inner spacers 117 and the plurality of voids 119 may be located between the substrate 102 and a channel (from the plurality of channels 110) closest to the substrate 102. For example, alternating inner spacers 117 and voids 119 (e.g., inner voids) may be located between the substrate 102 and a channel (from the plurality of channels 110) closest to the substrate 102. The plurality of inner spacers 117 and the plurality of voids 119 may be located between two adjacent channels (e.g., two vertically adjacent channels) from the plurality of channels 110. For example, alternating inner spacers 117 and voids 119 (e.g., inner voids) may be located between two adjacent channels from the plurality of channels 110. In some implementations, the rows of inner spacers 117 may include vertically stacked inner spacers, and the rows of voids 119 may include vertically stacked voids. In some implementations, two adjacent inner spacers (e.g., two vertically adjacent inner spacers) from the rows of inners spacers 107 may be separated by at least one void (e.g., 119). A void may be a at least one region that is free of a solid material. A void may include a cavity. A void may be occupied by a gas (e.g., air).

The inner spacers (e.g., 107, 117) may include polymer (e.g. polymer material). Different implementations may use different types of polymer. In some implementations, each inner spacer (e.g., 107, 117) may have a thickness or height of approximately 1-2 nanometers (nm). In some implementations, each void (e.g., 109, 119) may have a height of approximately 1-2 nanometers (nm). As will be further described below, the inner spacers (e.g., 107, 117) may help prevent the source 104 and/or the drain 106 from being formed too close to the gate 108, during a fabrication of the transistor 100. Without the inner spacers, part of the source 104 and/or the drain 106 may be formed substantially in the voids, which would cause the source 104 and the drain 106 to be too close to each other, and a current could flow between the source 104 and the drain 106 without a voltage being applied between the gate 108 and the substrate 102, which is not desirable.

It is noted that the configuration of the inner spacers (e.g., 107, 117) and the voids (e.g., 109, 119) may help reduce the overall effective K value of the inner spacers (e.g., 107, 117). This in turn helps reduce the parasitic capacitance of the inner spacers (e.g., 107, 117). Moreover, the use of at least one inner spacer (e.g., at least one row of inner spacer) and at least two voids (e.g., at least two rows of voids) located between (i) two adjacent channels and/or (ii) a substrate and a channel closest to the substrate, may help isolate the source 104 and the drain 106. In some implementations, the overall effective K value of the inner spacers (e.g., 107, 117) may be less than 5 (e.g., between 1-5, inclusive of all values in between including 1 and 5).

It is noted that the size and shape of the transistor 100 is exemplary. Moreover, some or all of the components of the transistor 100 shown may not be to scale. In addition, for the purpose of clarity, not all components may be shown in FIG. 1.

The transistor 100 may be configured as (i) a negative channel metal oxide semiconductor (NMOS) transistor, or (ii) a positive channel metal oxide semiconductor (PMOS) transistor. As will be further described below, a complementary metal-oxide-semiconductor (CMOS) structure may be defined by a first transistor (e.g., 100) configured as a NMOS transistor and a second transistor (e.g., 100) configured as a PMOS transistor. The transistor 100 may be a transistor means (e.g., means for first transistor, means for second transistor).

To operate as a NMOS transistor, the source 104 and the drain 106 may each include a N type dopant (N+). Moreover, at least some of the transistor 100 may be formed over a P-well formed in a substrate. To operate as a PMOS transistor, the source 104 and the drain 106 may each include P type dopant (P+). Moreover, at least some of the transistor 100 may be formed over a N-well formed in a substrate. A first transistor configured to operate as a NMOS transistor and a second transistor configured to operate as a PMOS transistor, may be used to form and define a CMOS structure in an integrated device. A first transistor configured to operate as a PMOS transistor and a second transistor configured to operate as a NMOS transistor, may be used to form and define a CMOS structure in an integrated device.

Figure 2:
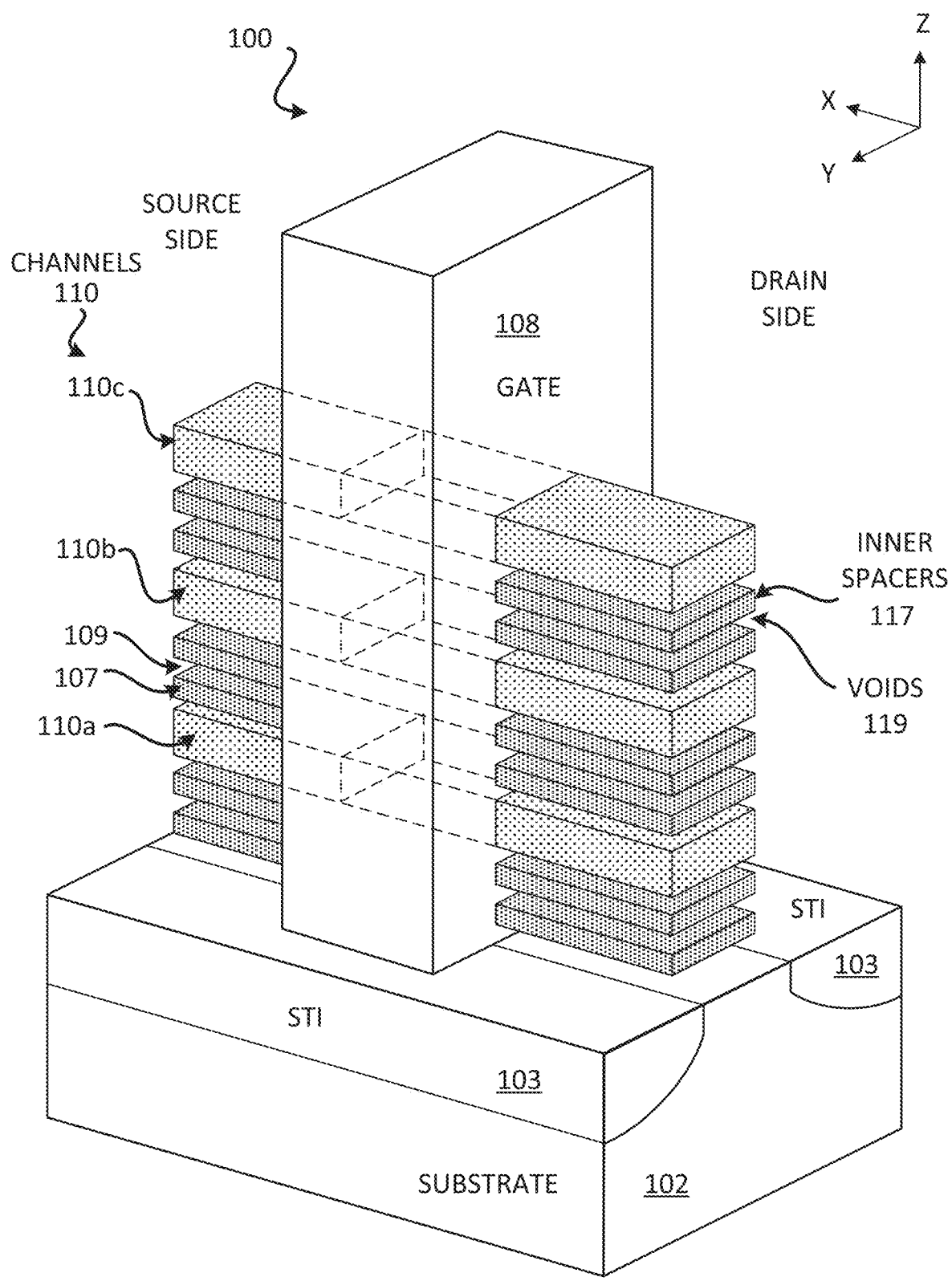
FIG. 2 illustrates an exemplary view of a gate surrounding channels formed over a substrate.

FIG. 2 illustrates an exemplary view of a plurality of inner spacers and voids located between channels. FIG. 2 illustrates an exemplary view of some components of the transistor 100. The transistor 100 includes the substrate 102, the gate 108, the plurality of channels 110 (which includes channel 110a, channel 110b, channel 110c), the plurality of inner spacers 107, the plurality of inner spacers 117, the plurality of voids 109, and the plurality of voids 119. The plurality of inner spacers 107 and/or 117 may be defined by rows of inner spacers. Although not shown for the purpose of clarity in FIG. 2, the transistor 100 includes the source 104 and the drain 106, as described in FIG. 1.

The plurality of inner spacers 107 and the plurality of voids 109 are located on a source side of the transistor 100 (e.g., between the source 104 and the gate 108). The plurality of inner spacers 107 may include rows of inner spacers. The rows of inner spacers may include vertically stacked inner spacers. The plurality of voids 109 may include rows of voids. The rows of voids may include vertically stacked voids. At least one inner spacer 107 and at least two voids 109 (formed in alternating fashion) are located between the substrate 102 and the channel 110a. At least one void 109 may be located closest to the substrate 102 and/or the channel 110a. At least one inner spacer 107 and at least two voids 109 (formed in alternating fashion) are located between the channel 110a and the channel 110b. At least one void 109 may be located closest to the channels (e.g., 110a, 110b). Similarly, at least one inner spacer 107 and at least two voids 109 (formed in alternating fashion) are located between the channel 110b and the channel 110c. At least one void 109 may be located closest to the channels (e.g., 110b, 110c).

The plurality of inner spacers 117 and the plurality of voids 119 are located on a drain side of the transistor 100 (e.g., between the drain 106 and the gate 108). The plurality of inner spacers 117 may include rows of inner spacers. The rows of inner spacers may include vertically stacked inner spacers. The plurality of voids 119 may include rows of voids. The rows of voids may include vertically stacked voids. At least one inner spacer 117 and at least two voids 119 (formed in alternating fashion) are located between the substrate 102 and the channel 110a. At least one inner spacer 117 and at least two voids 119 (formed in alternating fashion) are located between the channel 110a and the channel 110b. At least one void 119 may be located closest to the channels (e.g., 110a, 110b). Similarly, at least one inner spacer 117 and at least two voids 119 (formed in alternating fashion) are located between the channel 110b and the channel 110c. At least one void 119 may be located closest to the channels (e.g., 110b, 110c). The pattern shown between two adjacent channels (and/or between the substrate 102 and the closest adjacent channel), may be (i) void, (ii) inner spacer, (iii) void, (iv) inner spacer and (v) void. However, different implementations may have different numbers of inner spacers and/or voids between two adjacent channels (and/or between the substrate 102 and the closest adjacent channel). In some implementations, when there are "n" number of inner spacers between two adjacent channels (and/or between the substrate 102 and the closest adjacent channel), then there may be "n+1" number of voids between two adjacent channels (and/or between the substrate 102 and the closest adjacent channel).

Figure 3:
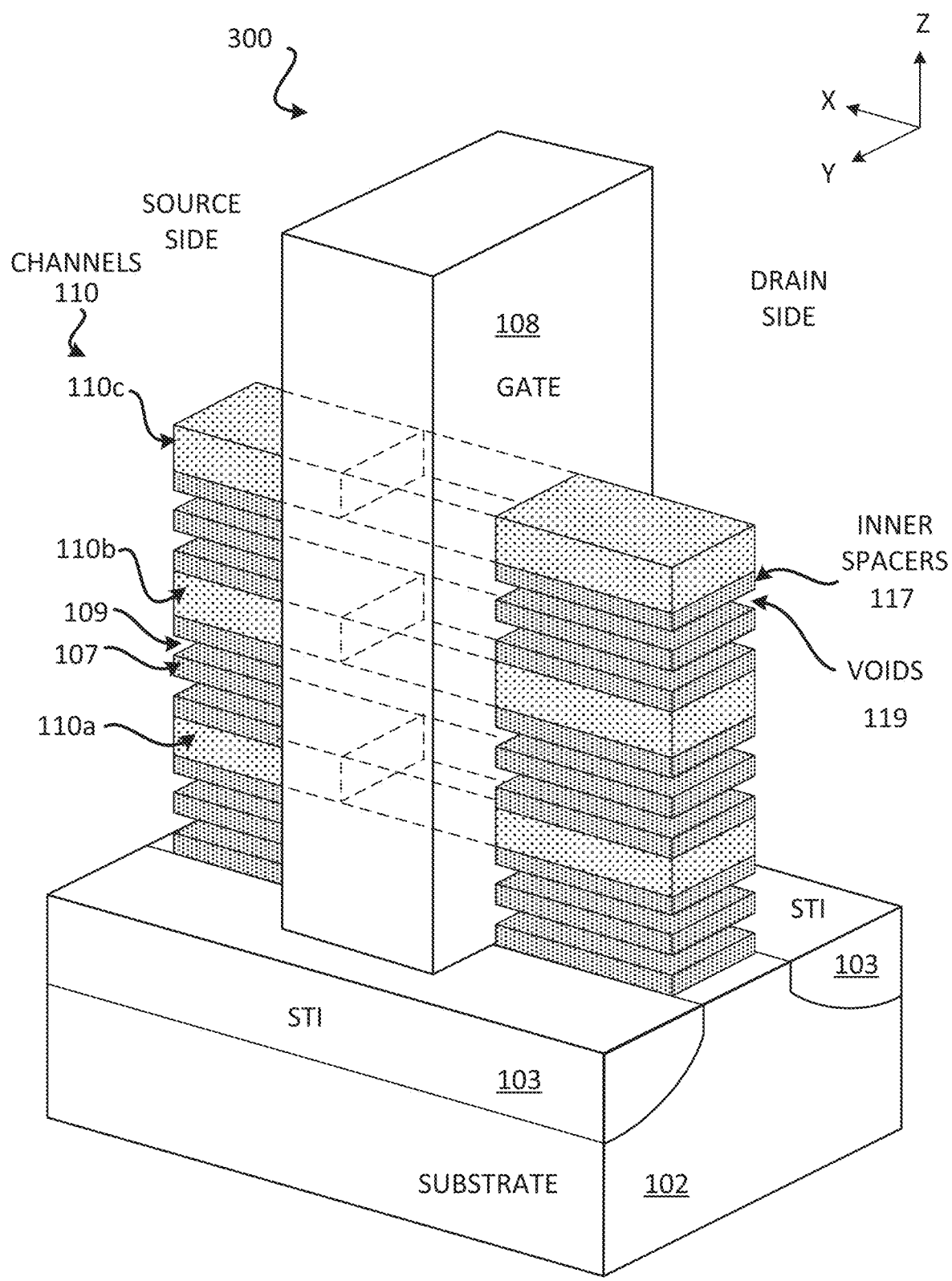
FIG. 3 illustrates an exemplary view of a gate surrounding channels formed over a substrate.

FIG. 3 illustrates an exemplary view of a plurality of inner spacers and voids located between channels. FIG. 3 illustrates an exemplary view of some components of the transistor 300. The transistor 300 is similar to the transistor 100 of FIGS. 1 and 2. Thus, the transistor 300 may include the same components as the transistor 100 of FIGS. 1 and 2. The transistor 300 includes the substrate 102, the gate 108, the plurality of channels 110 (which includes channel 110a, channel 110b, channel 110c), the plurality of inner spacers 107, the plurality of inner spacers 117, the plurality of voids 109, and the plurality of voids 119. The plurality of inner spacers 107 and/or 117 may be defined by rows of inner spacers (e.g., vertically stacked inner spacers). Although not shown for the purpose of clarity in FIG. 3, the transistor 300 includes the source 104 and the drain 106, as described in FIG. 1.

One difference between the transistor 300 and the transistor 100 may be in the arrangement of the plurality of inner spacers 107, the plurality of voids 109, the plurality of inner spacers 117 and the plurality of voids 119. As shown in FIG. 3, at least one inner spacer 107 may be located closest to the substrate 102 and/or the channel 110a. Similarly, at least one inner spacer 107 may be located closest to the channels (e.g., 110b, 110c). The pattern shown between two adjacent channels (and/or between the substrate 102 and the closest adjacent channel), may be (i) inner spacer, (ii) void, (iii) inner spacer, (iv) void, and (v) inner spacer. However, different implementations may have different numbers of inner spacers and/or voids between two adjacent channels (and/or between the substrate 102 and the closest adjacent channel). In some implementations, when there are "n" number of voids between two adjacent channels (and/or between the substrate 102 and the closest adjacent channel), then there may be "n+1" number of inner spacers between two adjacent channels (and/or between the substrate 102 and the closest adjacent channel).

Figure 4:
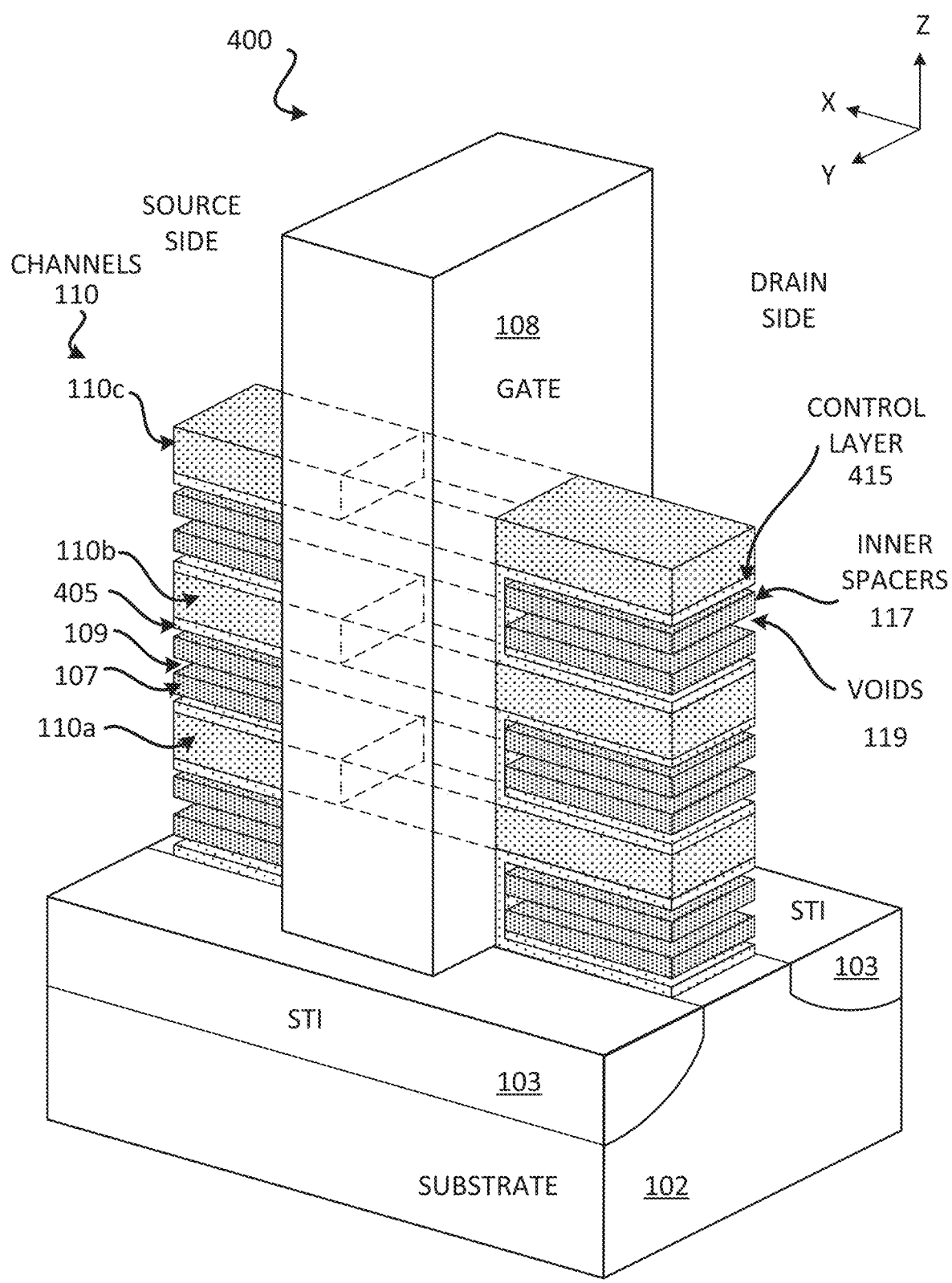
FIG. 4 illustrates an exemplary view of a gate surrounding channels formed over a substrate.

FIG. 4 illustrates an exemplary view of some components of a transistor 400 that includes at least one control layer, a plurality of inner spacers and voids located between channels. The transistor 400 is similar to the transistor 100 of FIGS. 1 and 2. Thus, the transistor 400 may include the same components as the transistor 100 of FIGS. 1 and 2. The transistor 400 includes the substrate 102, the gate 108, the plurality of channels 110 (which includes channel 110a, channel 110b, channel 110c), a control layer 405, a control layer 415, the plurality of inner spacers 107, the plurality of inner spacers 117, the plurality of voids 109, and the plurality of voids 119. The plurality of inner spacers 107 and/or 117 may be defined by rows of inner spacers (e.g., vertically stacked inner spacers). Although not shown for the purpose of clarity in FIG. 4, the transistor 400 includes the source 104 and the drain 106, as described in FIG. 1.

FIG. 4 illustrates the control layer 405 and the control layer 415. The control layer 405 and the control layer 415 may be part of a same control layer, or may be considered separate control layers. As shown in FIG. 4, the control layer 405 may be located over the source side of the transistor 400. The control layer 405 may include carbon and/or polymer. The control layer 405 may have a thickness of approximately 5 nanometers (nm). The control layer 405 may be located over a surface of the substrate 102, a surface of the gate 108 and/or over a surface of the plurality of channels 110. The control layer 405 may located between (i) the plurality of inner spacers 107 and the substrate 102, (ii) the plurality of inner spacers 107 and the gate 108 and/or (iii) the plurality of inner spacers 107 and the plurality of channels 110. The control layer 405 may be a byproduct of a fabrication process for forming the plurality of inner spacers 107 and the plurality of voids 109. The plurality of inner spacers 107 and the plurality of voids 109 of FIG. 4, may be arranged in a similar manner as the plurality of inner spacers 107 and the plurality of voids 109 of FIG. 2. At least one void 109 may be located vertically closest to a control layer 405 that is coupled to a plurality of channels 110. The control layer 405 may include at least one control layer. The control layer 405 between two adjacent channels may include a U shape across a side profile. The control layer 405 between the substrate and a bottom channel may include a U shape across a side profile.

As shown in FIG. 4, the control layer 415 may be located over the drain side of the transistor 400. The control layer 415 may include carbon and/or polymer. The control layer 415 may have a thickness of approximately 5 nanometers (nm). The control layer 415 may be located over a surface of the substrate 102, a surface of the gate 108 and/or over a surface of the plurality of channels 110. The control layer 415 may be located between (i) the plurality of inner spacers 117 and the substrate 102, (ii) the plurality of inner spacers 117 and the gate 108 and/or (iii) the plurality of inner spacers 117 and the plurality of channels 110. The control layer 415 may be a byproduct of a fabrication process for forming the plurality of inner spacers 117 and the plurality of voids 119. The plurality of inner spacers 117 and the plurality of voids 119 of FIG. 4, may be arranged in a similar manner as the plurality of inner spacers 117 and the plurality of voids 119 of FIG. 2. At least one void 119 may be located vertically closest to a control layer 415 that is coupled to a plurality of channels 110. The control layer 415 may include at least one control layer. The control layer 415 between two adjacent channels may include a U shape across a side profile. The control layer 415 between the substrate and a bottom channel may include a U shape across a side profile.

Figure 5:
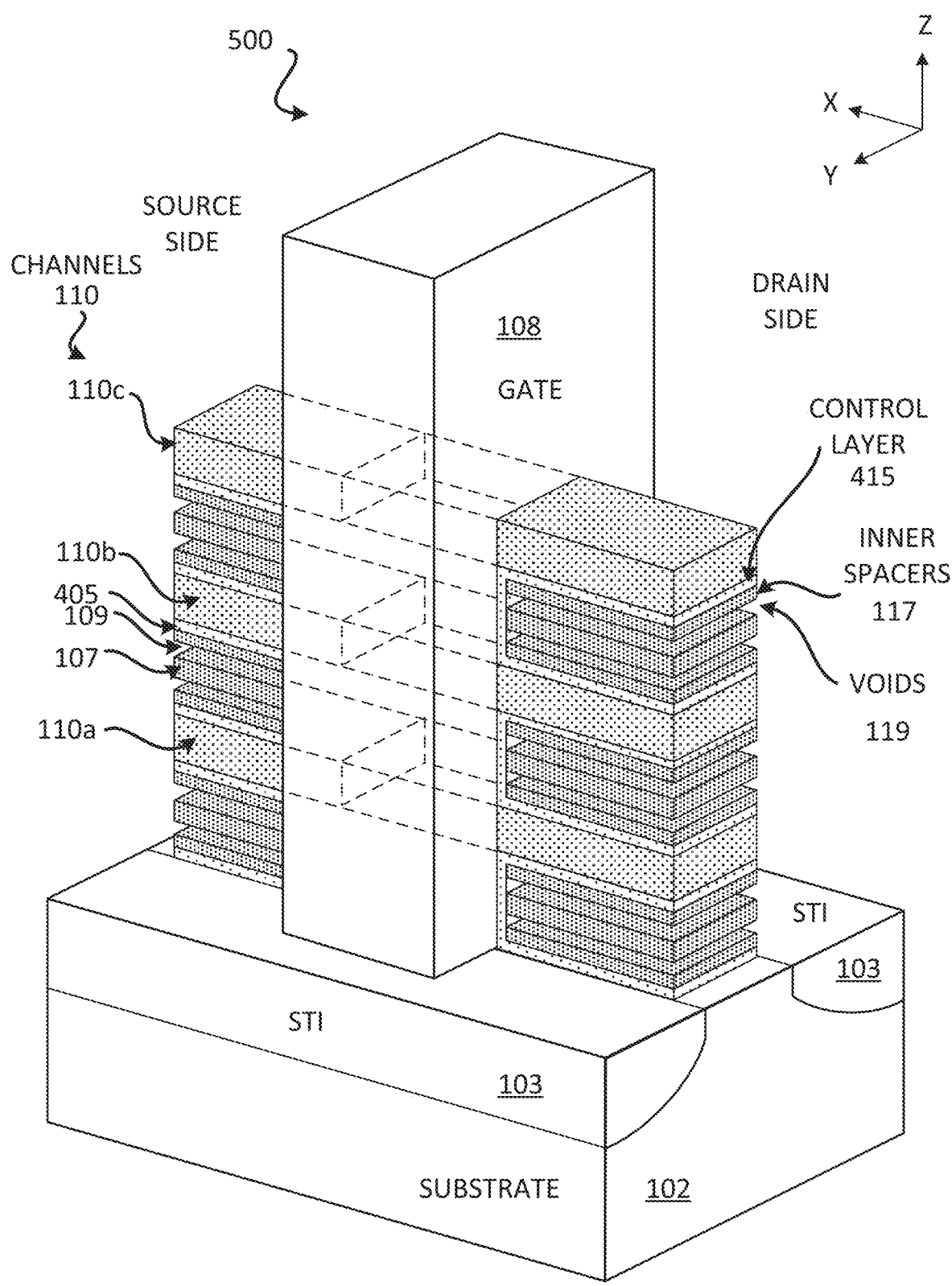
FIG. 5 illustrates an exemplary view of a gate surrounding channels formed over a substrate.

FIG. 5 illustrates an exemplary view of some components of a transistor 500 that includes a control layer, a plurality of inner spacers and voids located between channels. The transistor 500 is similar to the transistor 400 of FIG. 4. Thus, the transistor 500 may include the same components as the transistor 400 of FIG. 4. The transistor 400 includes the substrate 102, the gate 108, the plurality of channels 110 (which includes channel 110a, channel 110b, channel 110c), the control layer 405, the control layer 415, the plurality of inner spacers 107, the plurality of inner spacers 117, the plurality of voids 109, and the plurality of voids 119. The plurality of inner spacers 107 and/or 117 may be defined by rows of inner spacers (e.g., vertically stacked inner spacers). Although not shown for the purpose of clarity in FIG. 5, the transistor 500 includes the source 104 and the drain 106, as described in FIG. 1.

One difference between the transistor 500 and the transistor 400 may be in the arrangement of the plurality of inner spacers 107, the plurality of voids 109, the plurality of inner spacers 117 and the plurality of voids 119. As shown in FIG. 5, at least one inner spacer (e.g., 107, 117) may be located vertically closest to a control layer (e.g., 405, 415) coupled to the substrate 102 and/or the plurality of channels 110 (e.g., 110a, 110b, 110c).

Similar to the transistor 300 of FIG. 3, the transistor 500 may include a plurality of inner spacers 107 and a plurality of voids 109 that are arranged in alternating fashion. Similarly, the transistor 500 may include a plurality of inner spacers 117 and a plurality of voids 119 that are arranged in alternating fashion.

Figure 6:
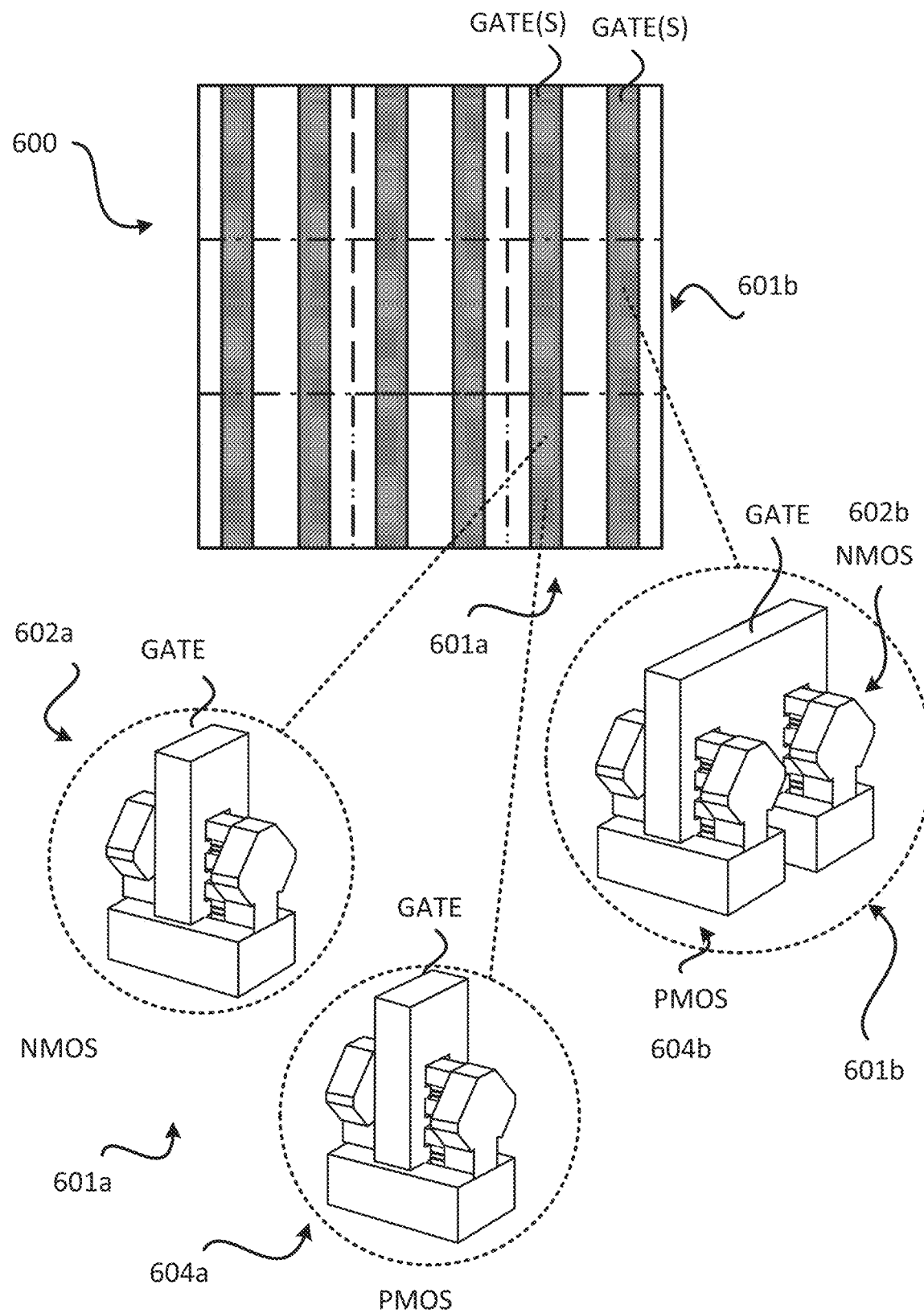
FIG. 6 illustrates an exemplary view of at least one cell that includes GAA FETs.

FIG. 6 illustrates at least one cell 600 of an integrated device. The cell 600 may represent at least one device level cell of an integrated device. An integrated device is further described in FIG. 15. As shown in FIG. 6, the cell 600 includes a CMOS structure 601a that is defined by a NMOS transistor 602a (e.g., first transistor) and a PMOS transistor 604a (e.g., second transistor). The NMOS transistor 602a may be the transistor 100, where the source and the drain include N type dopant (N+). Similarly, the PMOS transistor 604a may be the transistor 100, where the source and the drain include P type dopant (P+). The NMOS transistor 602a and the PMOS transistor 604a may have different gates.

FIG. 6 also illustrates that the cell 600 includes a CMOS structure 601b that is defined by a NMOS transistor 602b (e.g., first transistor) and a PMOS transistor 604b (e.g., second transistor). The NMOS transistor 602b may be the transistor 100, where the source and the drain include N type dopant (N+). Similarly, the PMOS transistor 604b may be the transistor 100, where the source and the drain include P type dopant (P+). The NMOS transistor 602b and the PMOS transistor 604b may share a gate.

It is noted that the NMOS transistor (e.g., 602a, 602b) and/or the PMOS transistor (e.g., 604a, 604b) may be formed by any of the transistors described in the disclosure. As will be further described below, an integrated device may include a plurality of cells 600, where each cell has a same or different arrangement of CMOS structures, NMOS transistors, and/or PMOS transistors.

Figure 7:
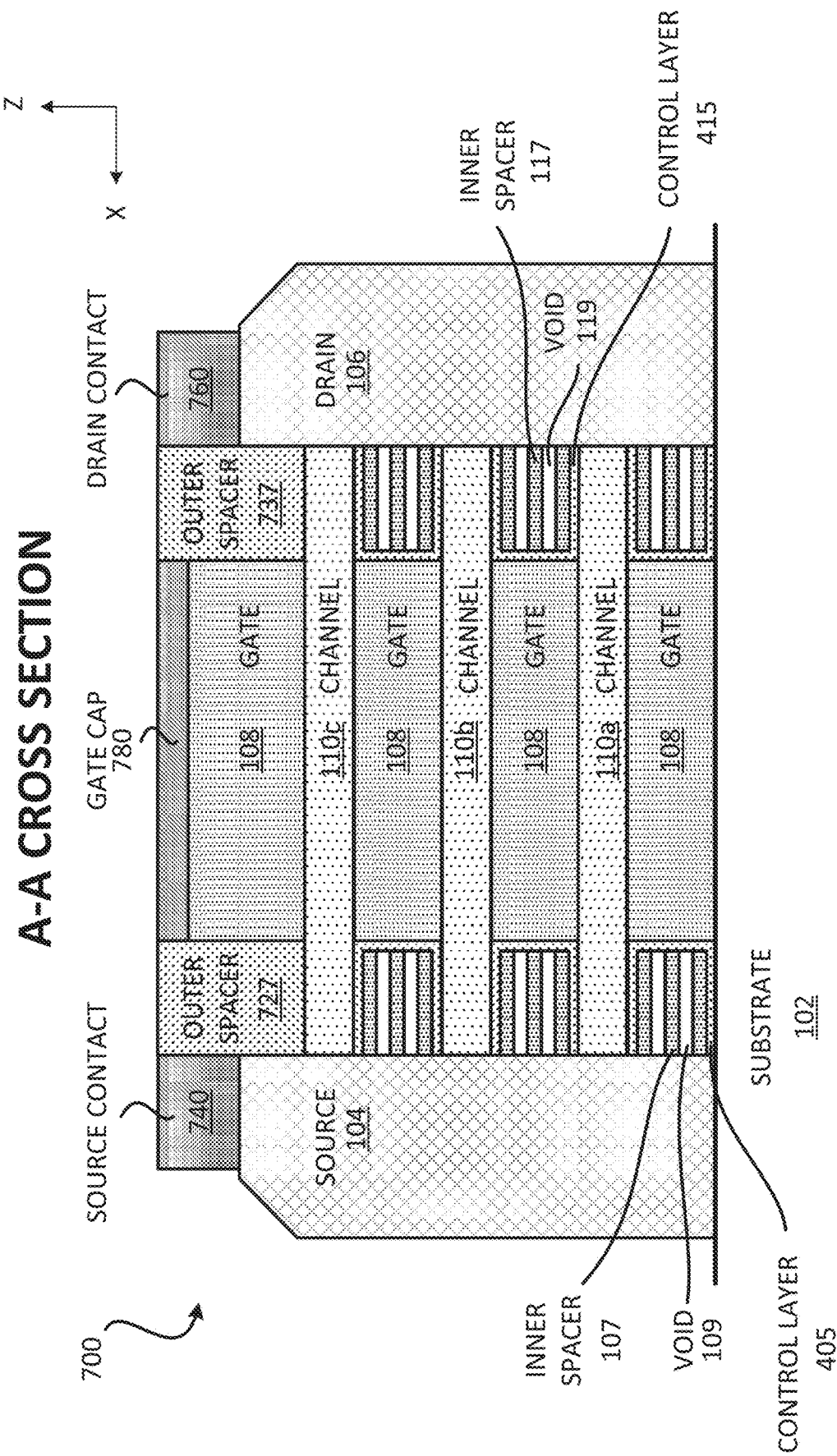
FIG. 7 illustrates an exemplary view of a first cross section of a GAA FET.

FIG. 7 illustrates a profile view of a transistor 700. The transistor 700 of FIG. 7, may represent a view across the cross-section AA of the transistor 100 of FIG. 1. As shown in FIG. 7, the transistor 700 is formed over the substrate 102. The substrate 102 may include silicon (Si). The substrate 102 may be a P substrate, a N substrate, or undoped. The transistor 700 includes the source 104, the drain 106, the gate 108, the plurality of channels 110 (e.g., 110a, 110b, 110c), the plurality of inner spacers 107, the plurality of voids 109, the control layer 405, a source contact 740, a gate cap 780, the plurality of inner spacers 117, the plurality of voids 119, the control layer 415, and a drain contact 760. In some implementations, the substrate 102 may be considered part of the transistor 100. Although not shown, the substrate 102 may include wells, such as a P-well and an N-well.

The control layer 405 and the control layer 415 may be separate control layers or may be considered part of a same control layer. The control layer 405 and/or 415 may include carbon and/or polymer (e.g., carbon that includes polymer material). The thickness of the control layer 405 and/or 415 may be approximately 5 nanometers (nm). The control layer 405 and/or 415 may be coupled to a surface (e.g., horizontal surface) of the plurality of channels 110 (e.g., 110a, 110b, 110c), a surface of the substrate 102 and/or a surface (e.g., vertical surface) of the gate 108.

The control layer 405 may be coupled to the source 104. The plurality of inner spacers 107 and the plurality of voids 109 may be located between the source 104 and the control layer 405. The plurality of inner spacers 107 and the plurality of voids 109 may be located between the source 104 and the gate 108. At least one inner spacer 107 (e.g., at least one row of inner spacer) and at least two voids 109 (e.g., at least two rows of voids) may be located between (i) two adjacent channels (e.g., 110a and 110b, 110b and 110c) and/or (ii) the substrate 102 and a channel (e.g., 110a) closest to the substrate 102. At least two inner spacers 107 (e.g., at least two row of inner spacers) and at least one void 109 (e.g., at least two rows of voids) may be located between (i) two adjacent channels (e.g., 110a and 110b, 110b and 110c) and/or (ii) the substrate 102 and a channel (e.g., 110a) closest to the substrate 102. The inner spacers 107 and the voids 109 may alternate between an inner spacer and a void. An inner spacer 107 may be coupled to an upper portion of the control layer 405. Another inner spacer 107 may be coupled to a lower portion of the control layer 405.

The source contact 740 is coupled to the source 104. The gate cap 780 may be coupled to and located over the gate 108. The outer spacer 727 may be located over the plurality of channels 110 (e.g., coupled to channel 110c). The outer spacer 727 may be located between the source 104 and the gate 108. The outer spacer 727 may be located between the source contact 740 and the gate 108 (and/or the gate cap 780). The gate 108 may include a metal. The gate 108 may include a high K metal gate (HKMG). The gate cap 780 may include a dielectric. For example, the gate cap 780 may include silicon nitride (SiN). In some implementations, a gate contact (not shown) may be coupled to the gate cap 780. The gate contact (not shown) may be configured to be electrically coupled to the gate 108 through the gate cap 780. The gate contact may include an electrically conductive material.

The control layer 415 may be coupled to the drain 106. The plurality of inner spacers 117 and the plurality of voids 119 may be located between the drain 106 and the control layer 415. The plurality of inner spacers 117 and the plurality of voids 119 may be located between the drain 106 and the gate 108. At least one inner spacer 117 (e.g., at least one row of inner spacer) and at least two voids 119 (e.g., at least two rows of voids) are located between (i) two adjacent channels (e.g., 110a and 110b, 110b and 110c) and/or (ii) the substrate 102 and a channel (e.g., 110a) closest to the substrate 102. At least two inner spacers 117 (e.g., at least two row of inner spacers) and at least one void 119 (e.g., at least two rows of voids) may be located between (i) two adjacent channels (e.g., 110a and 110b, 110b and 110c) and/or (ii) the substrate 102 and a channel (e.g., 110a) closest to the substrate 102. The inner spacers 117 and the voids 119 may alternate between an inner spacer and a void. An inner spacer 117 may be coupled to an upper portion of the control layer 415. Another inner spacer 117 may be coupled to a lower portion of the control layer 415.

The pattern shown between two adjacent channels (and/or between the substrate 102 and the closest adjacent channel), may be (i) inner spacer, (ii) void, (iii) inner spacer, (iv) void and (v) inner spacer. However, different implementations may have different numbers of inner spacers and/or voids between two adjacent channels (and/or between the substrate 102 and the closest adjacent channel). In some implementations, when there are "n" number of voids between two adjacent channels (and/or between the substrate 102 and the closest adjacent channel), then there may be "n+1" number of inner spacers between two adjacent channels (and/or between the substrate 102 and the closest adjacent channel).

The outer spacer 737 may be located over the plurality of channels 110 (e.g., coupled to channel 110c). The outer spacer 737 may be located between the drain 106 and the gate 108. The outer spacer 737 may be located between the drain contact 760 and the gate 108 (and/or the gate cap 780). The outer spacer 737 may be separate from the outer spacer 727 or may be considered part of the outer spacer 727 (or vice versa). The various contacts (e.g., source contact 740, drain contact 760) may be forms of an interconnect. The various contacts may be coupled to other interconnects (e.g., M1 interconnects).

Figure 8:
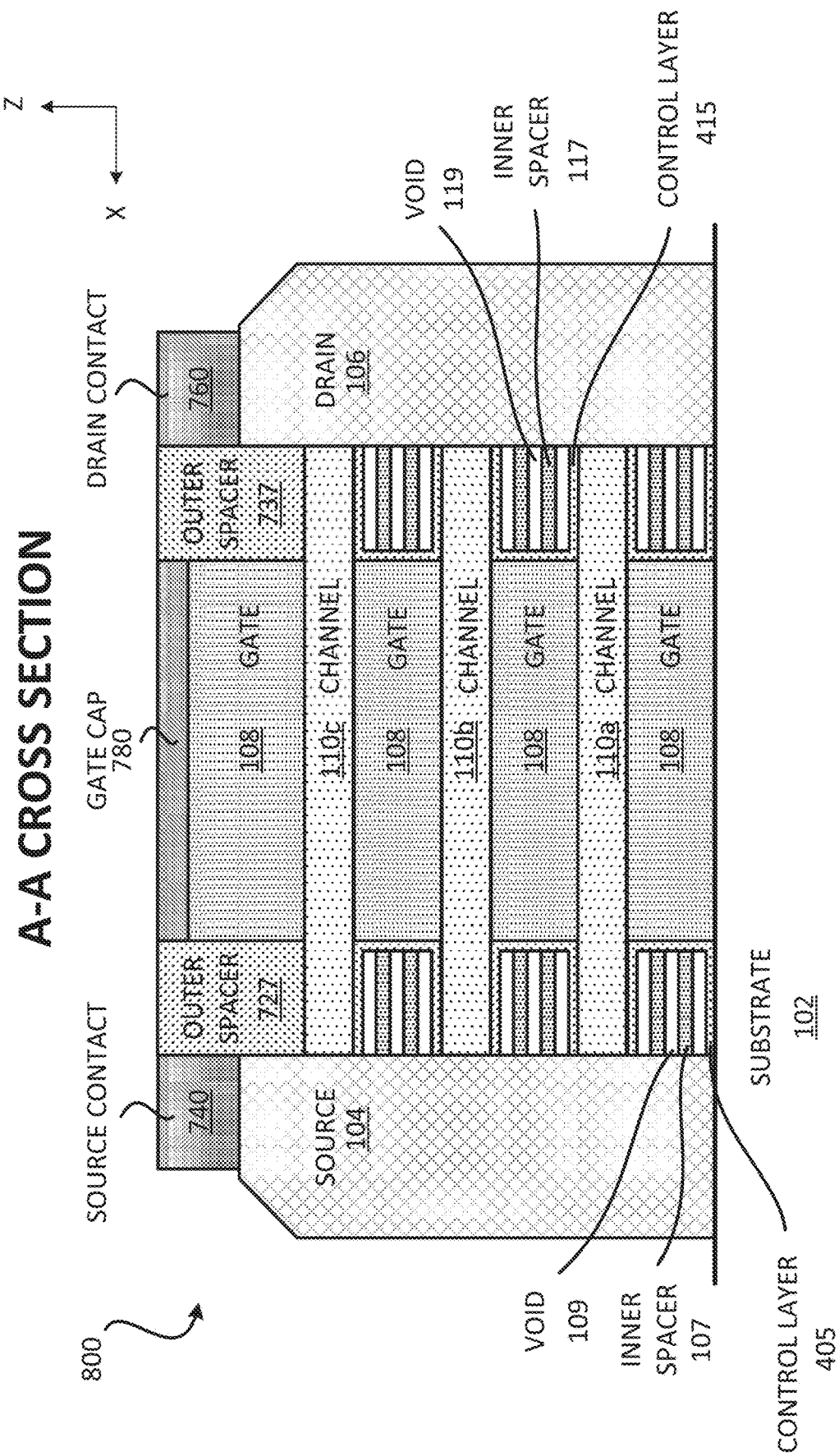
FIG. 8 illustrates an exemplary view of a first cross section of another GAA FET.

FIG. 8 illustrates a profile view of a transistor 800. The transistor 800 of FIG. 8, may represent a view across the cross-section AA of a transistor similar to the transistor 100 of FIG. 1. The transistor 800 is similar to the transistor 700, and thus may include similar components as the transistor 700.

One difference between the transistor 800 and the transistor 700 may be in the arrangement of the plurality of inner spacers 107, the plurality of voids 109, the plurality of inner spacers 117 and the plurality of voids 119. As shown in FIG.

8, at least one void (e.g., 109, 119) may be located closest to the substrate 102 and/or the channel 110a. Similarly, at least one void (e.g., 109, 119) may be located closest to the channels (e.g., 110b, 110c). A void 109 may be coupled to an upper portion of the control layer 405. Another void 109 may be coupled to a lower portion of the control layer 405. A void 119 may be coupled to an upper portion of the control layer 415. Another void 119 may be coupled to a lower portion of the control layer 415.

The pattern shown between two adjacent channels (and/or between the substrate 102 and the closest adjacent channel), may be (i) void, (ii) inner spacer, (iii) void, (iv) inner spacer and (v) void. However, different implementations may have different numbers of inner spacers and/or voids between two adjacent channels (and/or between the substrate 102 and the closest adjacent channel). In some implementations, when there are "n" number of inner spacers between two adjacent channels (and/or between the substrate 102 and the closest adjacent channel), then there may be "n+1" number of voids between two adjacent channels (and/or between the substrate 102 and the closest adjacent channel).

Figure 9:
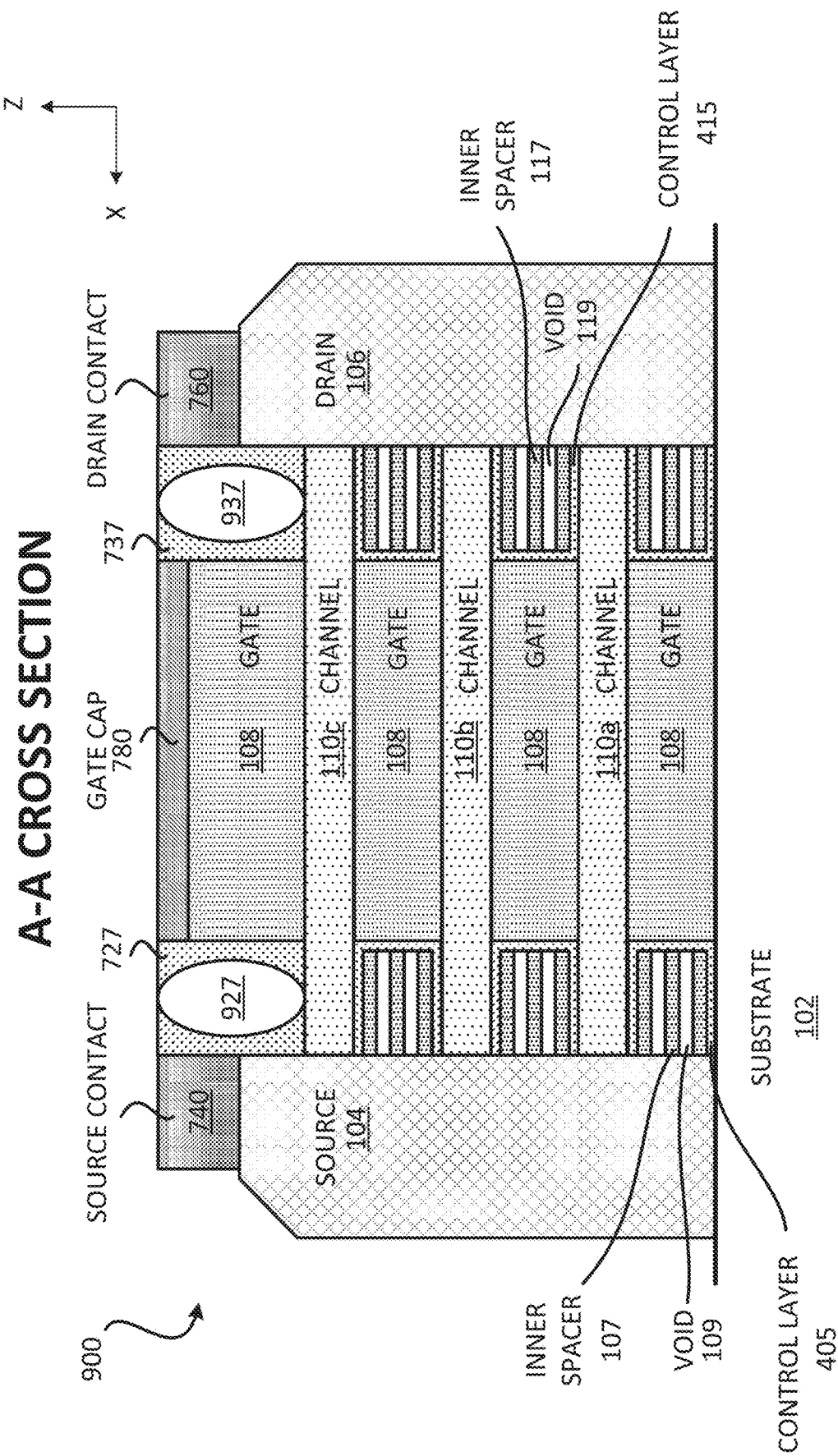
FIG. 9 illustrates an exemplary view of a first cross section of another GAA FET.

FIG. 9 illustrates a profile view of a transistor 900. The transistor 900 of FIG. 9, may represent a view across the cross-section AA of the transistor 100 of FIG. 1. The transistor 900 is similar to the transistor 700, and thus may include similar components as the transistor 700. The transistor 900 includes an outer spacer 727 that includes at least one void 927. The transistor 900 may also include an outer spacer 737 that includes at least one void 937 The void 927 and the void 937 may be at least partially vertical void (e.g., height of the void is greater than the width and/or length of the void). The void 927 and the void 937 may be outer spacer voids.

Figure 10:
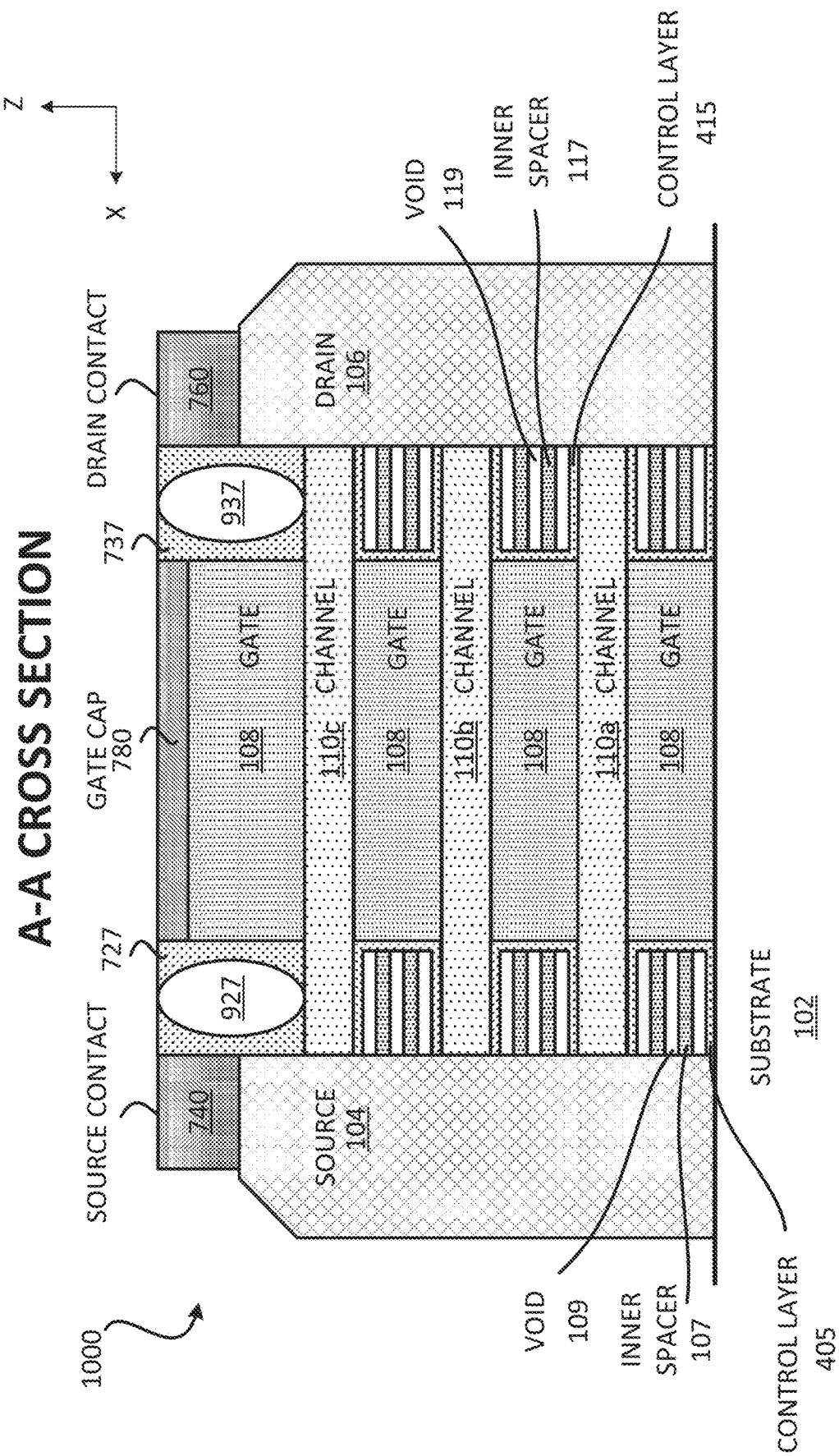
FIG. 10 illustrates an exemplary view of a first cross section of another GAA FET.

FIG. 10 illustrates a profile view of a transistor 1000. The transistor 1000 of FIG. 10, may represent a view across the cross-section AA of a transistor similar to the transistor 100 of FIG. 1. The transistor 1000 is similar to the transistor 800, and thus may include similar components as the transistor 800. The transistor 1000 includes an outer spacer 727 that includes at least one void 927. The transistor 1000 may also include the outer spacer 737 that includes at least one void 937. The void 927 and the void 937 may be at least partially vertical void (e.g., height of the void is greater than the width and/or length of the void). The void 927 and the void 937 may be outer spacer voids.

A void may be a at least one region that is free of a solid material. A void may include a cavity. A void may be occupied by a gas (e.g., air). The void 927 and/or the void 937 may help reduce the overall effective K value of the outer spacers (e.g., 927, 937). This in turn helps reduce the parasitic capacitance of the outer spacers (e.g., 927, 937). Moreover, the outer spacers with voids (e.g., outer spacer voids) may help isolate the source 104 and the drain 106. In some implementations, the overall effective K value of the outer spacers (e.g., 927, 937) may be less than 5 (e.g., between 1-5, inclusive of all values in between including 1 and 5). The channels (e.g., 110) described in the disclosure include silicon. In some implementations, any of the channels (e.g., 110) described in the disclosure may include silicon germanium (SiGe).

Figure 11:
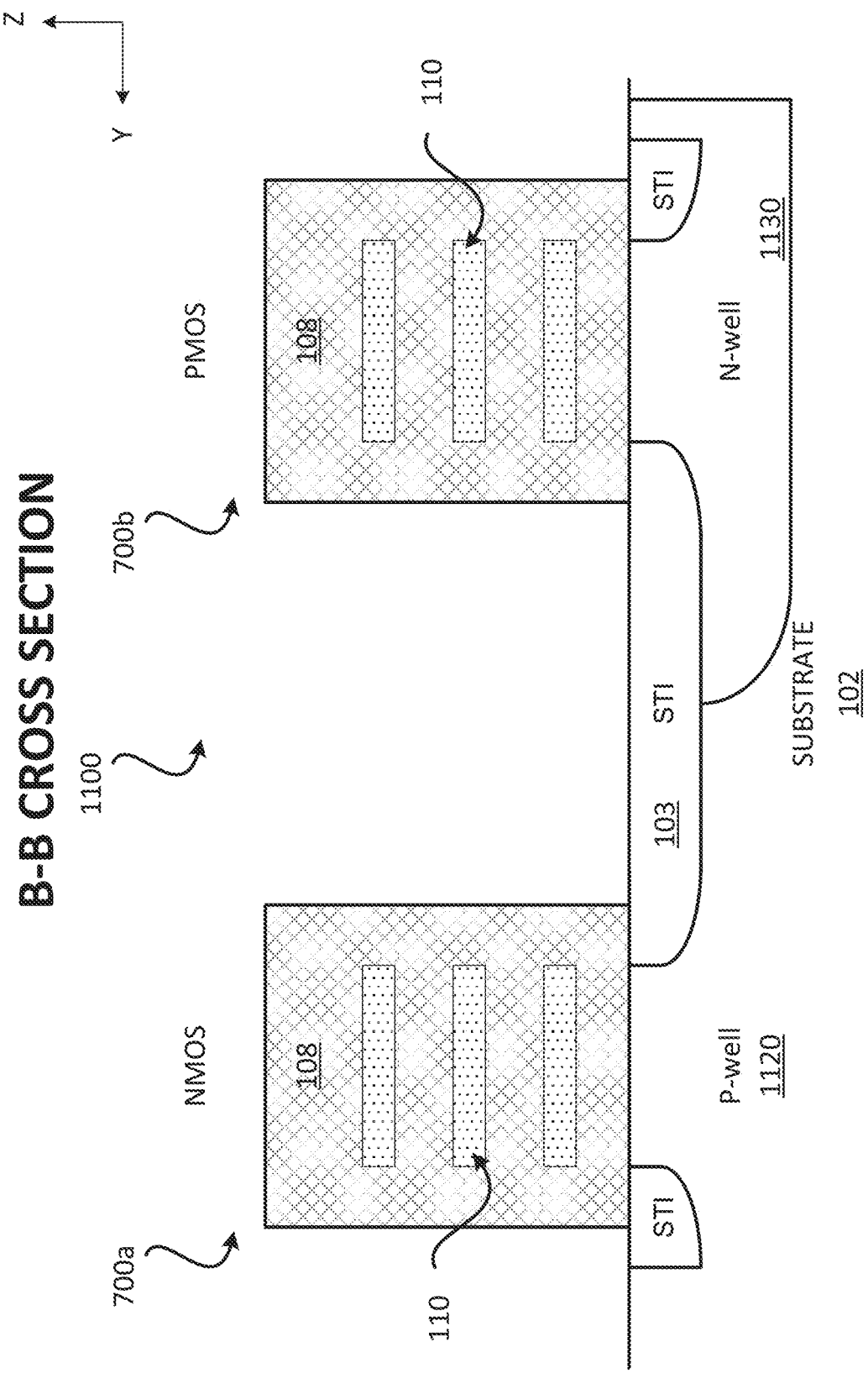
FIG. 11 illustrates an exemplary view of a structure that includes a positive channel metal oxide semiconductor (PMOS) transistor and a negative channel metal oxide semiconductor (NMOS) transistor.

In some implementations, a NMOS transistor and a PMOS transistor may be formed to operate as a complementary metal-oxide-semiconductor (CMOS). FIG. 11 illustrates a first structure 1100 formed over the substrate 102. The first structure 1100 includes the transistor 700a and the transistor 700b. The transistor 700a may be a first transistor configured to operate as a NMOS, and the transistor 700b may be a second transistor configured to operate as a PMOS. The transistor 700a is formed over the P-well 1120, while the transistor 700b is formed over the N-well 1130. Both the transistor 700a and the transistor 700b include their own respective gate 108 (e.g., first gate for the transistor 700a, second gate for the transistor 700b). In some implementations, the first structure 1100 may be configured to operate as a complementary metal-oxide-semiconductor (CMOS) structure. The P-well 1120 may represent the substrate 102. For example, the substrate 102 may be a P substrate (substrate that is doped of P type dopant). Alternatively, the substrate 102 may be a N substrate (substrate that is doped with a N type dopant), and a P well is formed in the substrate 102. For example, the N-well 1130 may become a P well.

Figure 12:
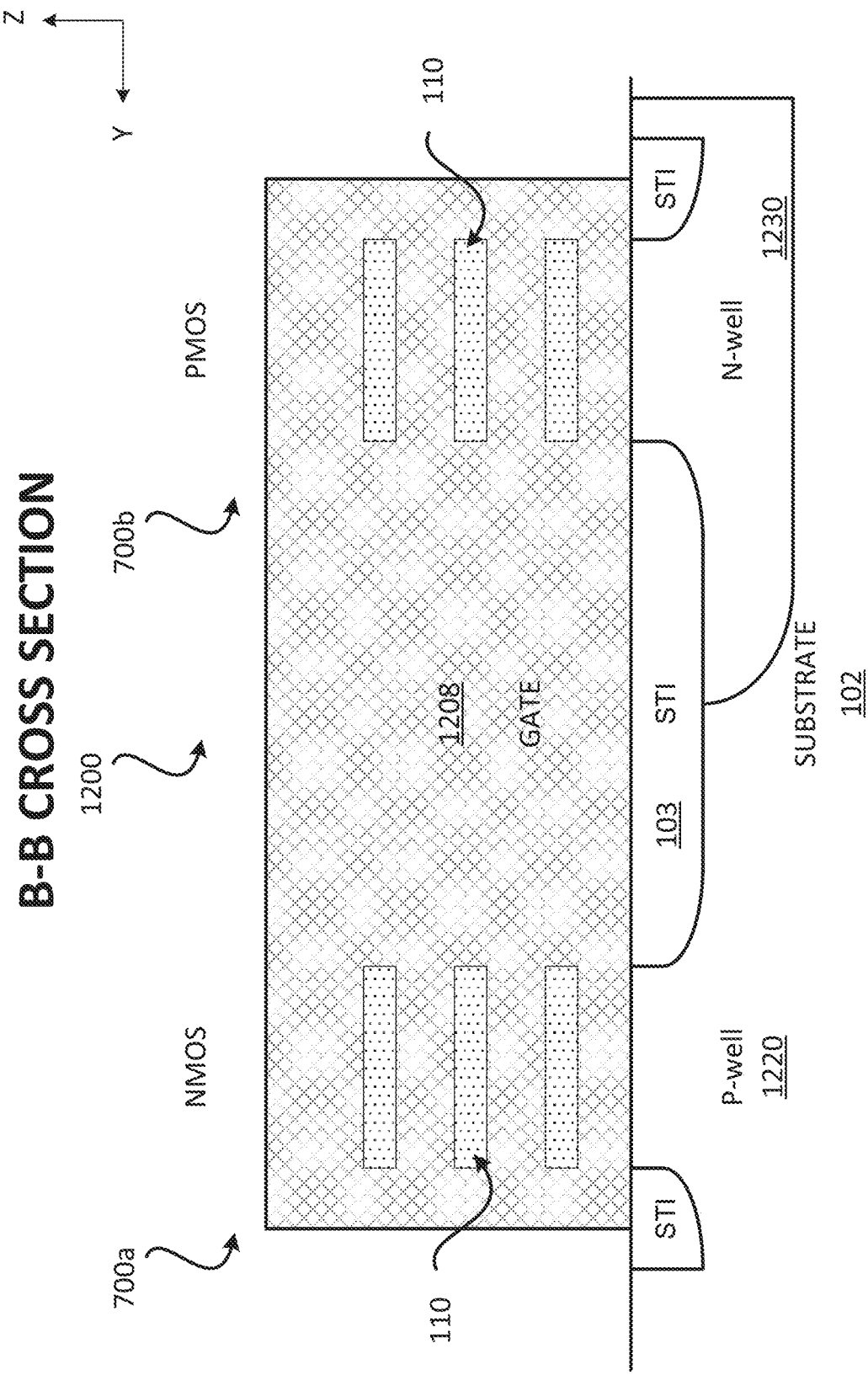
FIG. 12 illustrates an exemplary view of another structure that includes a PMOS transistor and a NMOS transistor.

FIG. 12 illustrates another implementation of a CMOS. FIG. 12 illustrates a second structure 1200 formed over the substrate 102. The second structure 1200 includes the transistor 700a and the transistor 700b. The transistor 700a may be a first transistor configured to operate as a NMOS, and the transistor 700b may be a second transistor configured to operate as a PMOS. The transistor 700a is formed over the P-well 1220, while the transistor 700b is formed over the N-well 1230. The P-well 1220 may represent the substrate 102. For example, the substrate 102 may be a P substrate (substrate that is doped of P type dopant). Alternatively, the substrate 102 may be a N substrate (substrate that is doped with a N type dopant), and a P well is formed in the substrate 102. For example, the N-well 1230 may become a P well.

As shown in FIG. 12, the transistor 700a and the transistor 700b share a same gate 1208. Thus, for example, the transistor 700a may include a first gate, and the transistor 700b may include a second gate, where the first gate and the second gate are part of the same gate 1208. In some implementations, the second structure 1200 may be configured to operate as a complementary metal-oxide-semiconductor (CMOS) structure. It is noted that in this example, a voltage (that is high enough) applied to the gate 1208 may induce a current flow in both the transistor 700a and the transistor 700b of the second structure 1200. In this example, the lowest possible voltage that is applied to the gate 1208 must be high enough to meet the threshold voltage requirement of both transistors (700a, 700b). Thus, if one transistor has a different threshold voltage requirement to induce a current flow than the other transistor, the higher threshold voltage requirement will be used. It is noted that any transistors (e.g., 100, 300, 400, 500, 600, 700, 800, 900, 1000) described in the disclosure may be used as a NMOS and PMOS for a CMOS structure.

At least one inner spacer (e.g., 107, 117) may be means for inner spacing (e.g., means for first inner spacing, means for second inner spacing). At least one outer spacer (e.g., 727, 737) may be means for outer spacing (e.g., means for first outer spacing, means for second outer spacing). The gate (e.g., 108) may be means for gate (e.g., means for first gate, means for second gate). The control layer (e.g., 405, 415) may be means for control layering. At least one channel (e.g., 110) may be means for channeling (e.g., means for first channeling, means for second channeling). A source (e.g., 104) may be means for source (e.g., means for first source, means for second source). A drain (e.g., 106) may be means for drain (e.g., means for first drain, means for second drain).

It is noted that the above features are not limited to a transistor that includes a multi-channel GAA FET. In some implementations, any of the features described in the disclosure may also be applicable to a single channel GAA FET (e.g., GAA FET that includes one or more channels). Having described various transistors, including a NMOS transistor and a PMOS transistor, a sequence for fabricating one or more transistors will now be described below.

Exemplary Sequence for Fabricating a Transistor that Includes Inner Spacers and Voids Between Channels In some implementations, fabricating a transistor includes several processes. FIGS. 13A-13I illustrate an exemplary sequence for providing or fabricating a transistor. In some implementations, the sequence of FIGS. 13A-13I may be used to provide or fabricate the transistor of FIGS. 1-12 and/or other transistors described in the present disclosure. It is noted that the sequence for fabricating the transistor may be used to provide or fabricate a CMOS structure having a NMOS transistor and a PMOS transistor. In addition, the sequence for fabricating the transistor may be used to fabricate several transistors (e.g., NMOS transistor, PMOS transistor) at the same time. However, for the purpose of clarity, the sequence of FIGS. 13A-13I illustrates the fabrication of one transistor.

It should be noted that the sequence of FIGS. 13A-13I may combine one or more stages in order to simplify and/or clarify the sequence for providing or fabricating a transistor. In some implementations, the order of the processes may be changed or modified. In some implementations, one or more of processes may be replaced or substituted without departing from the spirit of the disclosure.

Figure 13A:
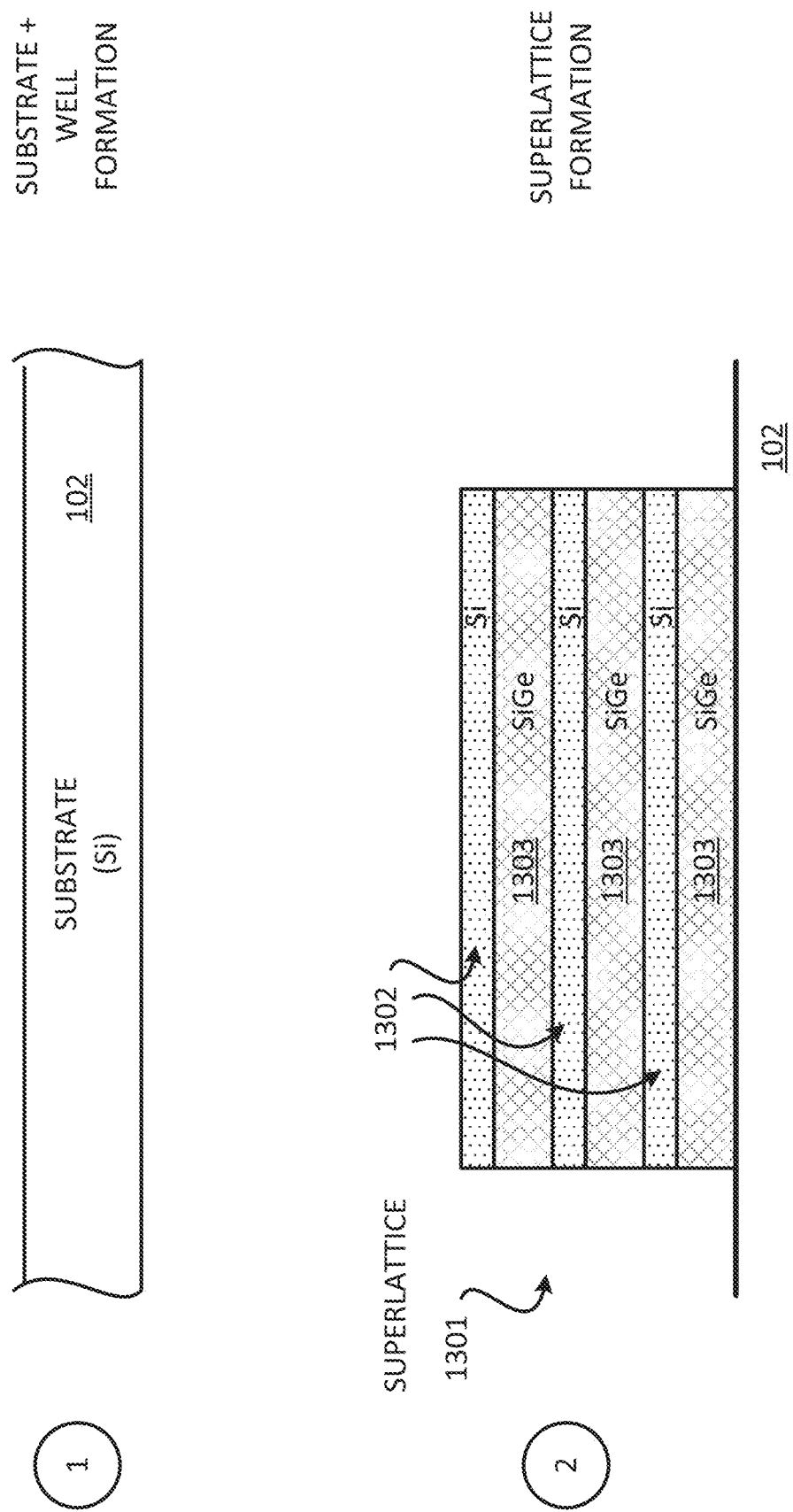

Stage 1, as shown in FIG. 13A, illustrates a state after a substrate 102 is provided. Different implementations may provide different materials for the substrate 102. In some implementations, the substrate 102 may include silicon (Si). Stage 1 may also illustrate a state after one or more wells (e.g., P-well, N-well) are formed in the substrate 102. Well formation may include ion formation or a diffusion process. In some implementations, the substrate 102 may already include dopant. For example, if the substrate 102 is a P substrate, then a N well may be formed in the substrate 102. If the substrate 102 is a N substrate, then a P well may be formed in the substrate 102. In some implementations, oxidation, photoresist, masking, photoresist removal, etching (e.g., acid etching), and well formation may be used to provide the substrate 102. For the purpose of clarity, wells are not shown.

Stage 2 illustrates a state after superlattice formation. In some implementations, superlattice formation includes forming a stacked structure of alternating layers of a silicon (Si) layer 1302 and a silicon germanium (SiGe) layer 1303 over the substrate 102 and creating one or more superlattices 1301 from the stacked structure by removing (e.g., etching, dry etching, wet etching) portions of the stacked structure. In this example, a first SiGe layer 1303 may be deposited over the substrate 102, and then a first Si layer 1302 may be deposited over the first SiGe layer 1303, and so on and so forth (e.g., first SiGe layer, first Si layer, second SiGe layer, second Si layer, third SiGe layer, third Si layer). Different implementations may use different concentrations of germanium (Ge) for the SiGe layers 1303.

The process of forming a stacked structure may include using an epitaxial process. The process of fabricating superlattices may include fabricating one or more shallow trench isolation (STI) (which are not shown). Superlattice formation may also include a fin reveal process where portions of the STI are removed, exposing at least some portions of the superlattice and/or fin. As will be further described below, the silicon (Si) layers 1302 may become the channels 110.

Figure 13B:
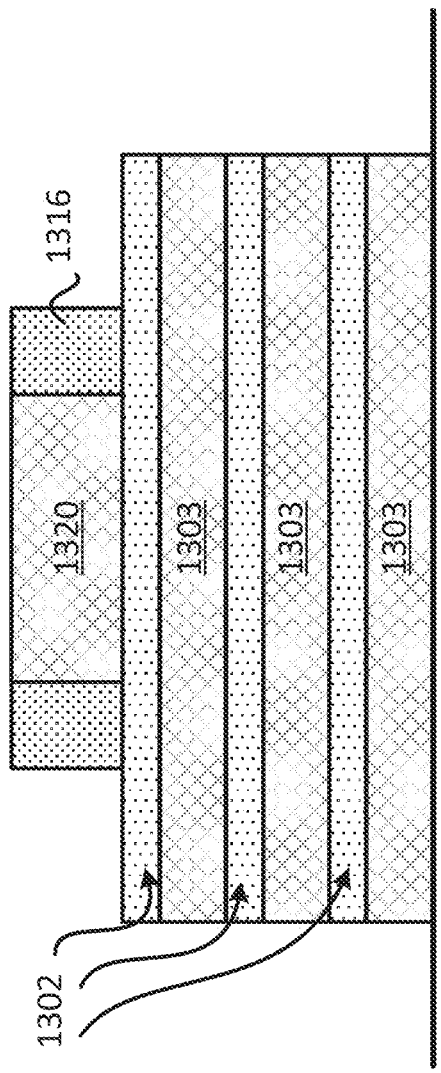
Figure 13B:
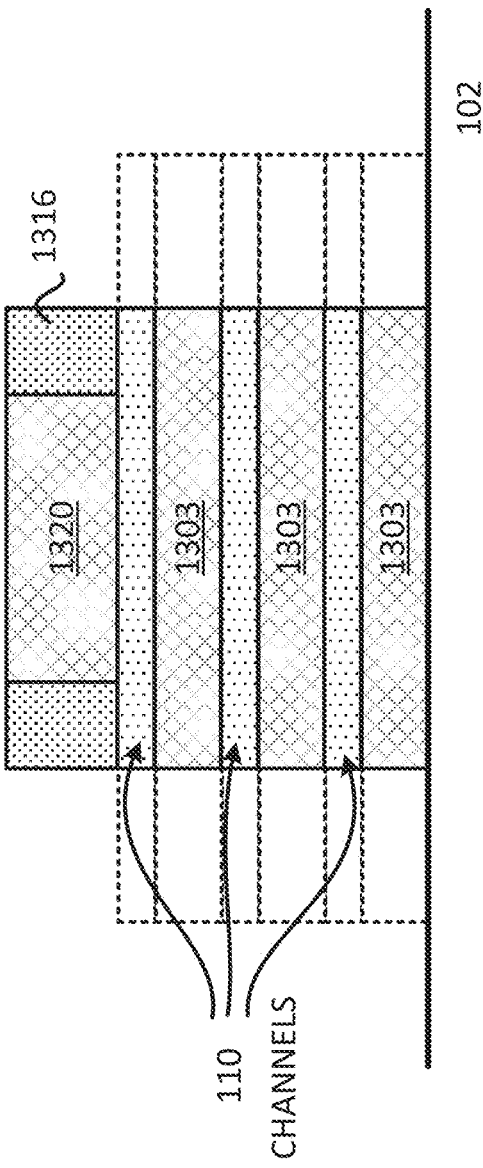

Stage 3, as shown in FIG. 13B, illustrates a state after dummy gate and spacer formation. A dummy gate 1320 is formed over the superlattice 1301. In addition, spacers 1316 are formed over the superlattice 1301. More specifically, spacers 1316 are formed over the superlattice 1301 and next to (and on each side of) the dummy gate 1320. It is noted that the spacer 1316 is exemplary. A chemical vapor deposition (CVD) process and/or an atomic layer deposition (ALD) process may be used to form the dummy gate 1320 and/or the spacer 1316. There may be an oxide layer between the dummy gate 1320 and the superlattice 1301. The dummy gate 1320 may include a poly gate.

Stage 4 illustrates a state after cavity etching. After cavity etching, portions of the superlattice 1301 not covered by the dummy gate 1320 and/or the spacer 1316 are removed. Cavity etching may involve removing portions of the Si layers 1302 and portions of the SiGe layers 1303 of the superlattice 1301. A patterning and etching process may be used to remove portions of the Si layers 1302 and portions the SiGe layers 1303. In some implementations, the remaining Si layers 1320 may define a plurality of channels 110.

Figure 13C:
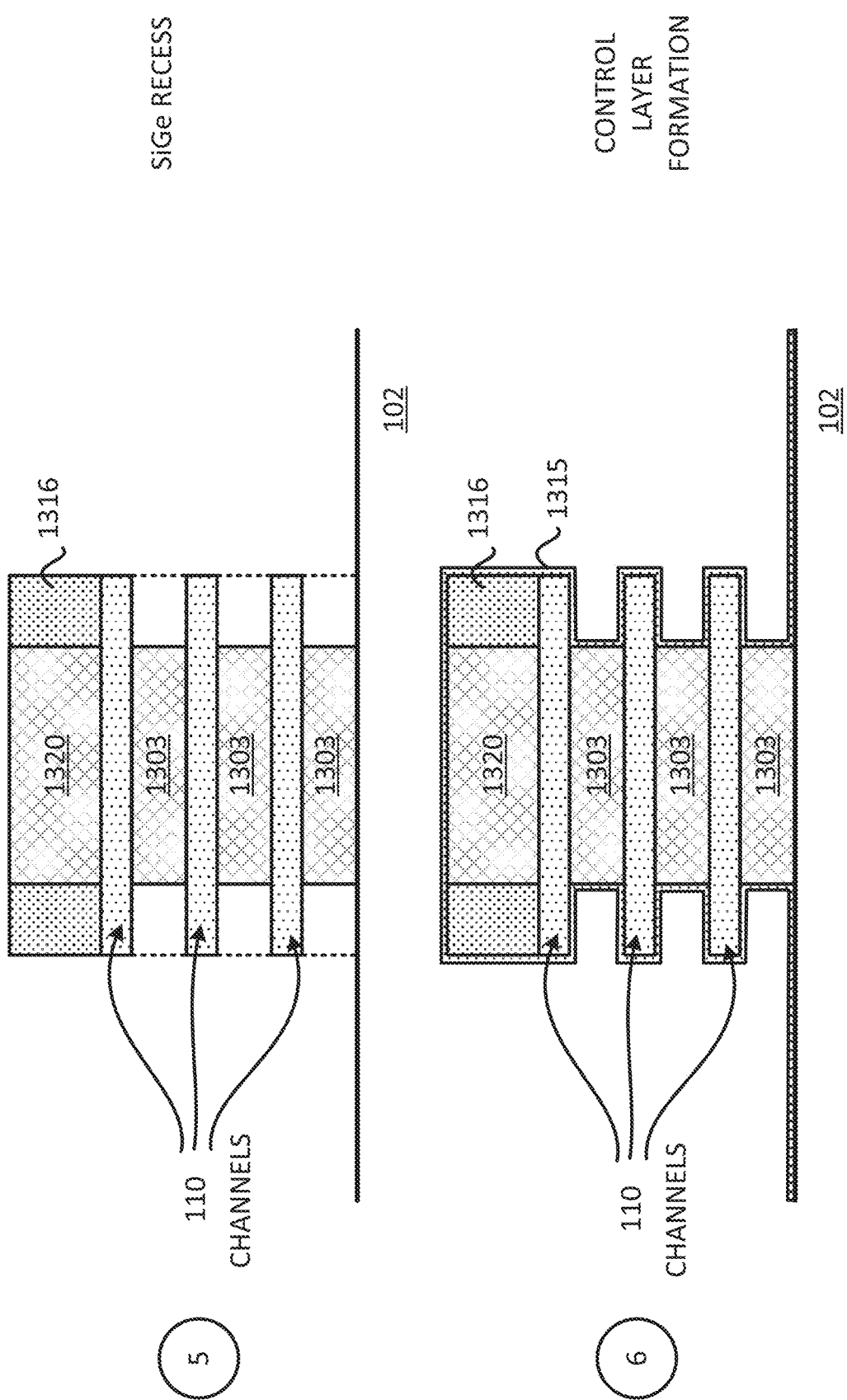

Stage 5, as shown in FIG. 13C, illustrates a state after SiGe recess. In some implementations, SiGe recess may be implemented when portions of the superlattice 1301 are removed, as described in Stage 4. Thus, Stages 4 and 5 may be implemented after a same process (e.g., same etching process). Different implementations may use different materials and/or solutions to remove portions of the SiGe layers 1303 and/or for SiGe recess. In some implementations, hydrofluoric acid (HF), hydrogen peroxide ($H_2O_2$), acetic acid ($CH_3COOH$), and/or combinations thereof may be used to remove portions of the SiGe layers 1303 and/or for SiGe recess.

Moreover, as mentioned above, in some implementations, the channels (e.g., 110) may include silicon germanium (SiGe). In such instances, tetramethyl ammonium hydroxide (TMAH) may be used to create a Si recess (instead of the SiGe recess). Thus, in this example, the SiGe layers 1303 would define the plurality of channels 110. When the SiGe layers 1303 define as the plurality of channels 110, the Si layers 1302 and the SiGe layers 1303 may be deposited in a different order during Stage 2 of FIG. 13A. For example, a first Si layer 1302 may be deposited over the substrate 102, and then a first SiGe layer 1303 may be deposited over the first Si layer 1302, and so on and so forth (e.g., first Si layer, first SiGe layer, second Si layer, second SiGe layer, third Si layer, third SiGe layer).

Stage 6 illustrates a state after control layer formation. For example, a control layer 1315 is conformally formed over the dummy gate 1320, the plurality of channels 110, the substrate 102, the SiGe layers 1303, the spacers 1316. The control layer 1315 may include carbon and/or polymer. For example, the control layer 1315 may include carbon with polymer materials. The control layer 1315 may have a thickness of approximately 5 nanometers (nm).

Figure 13D:
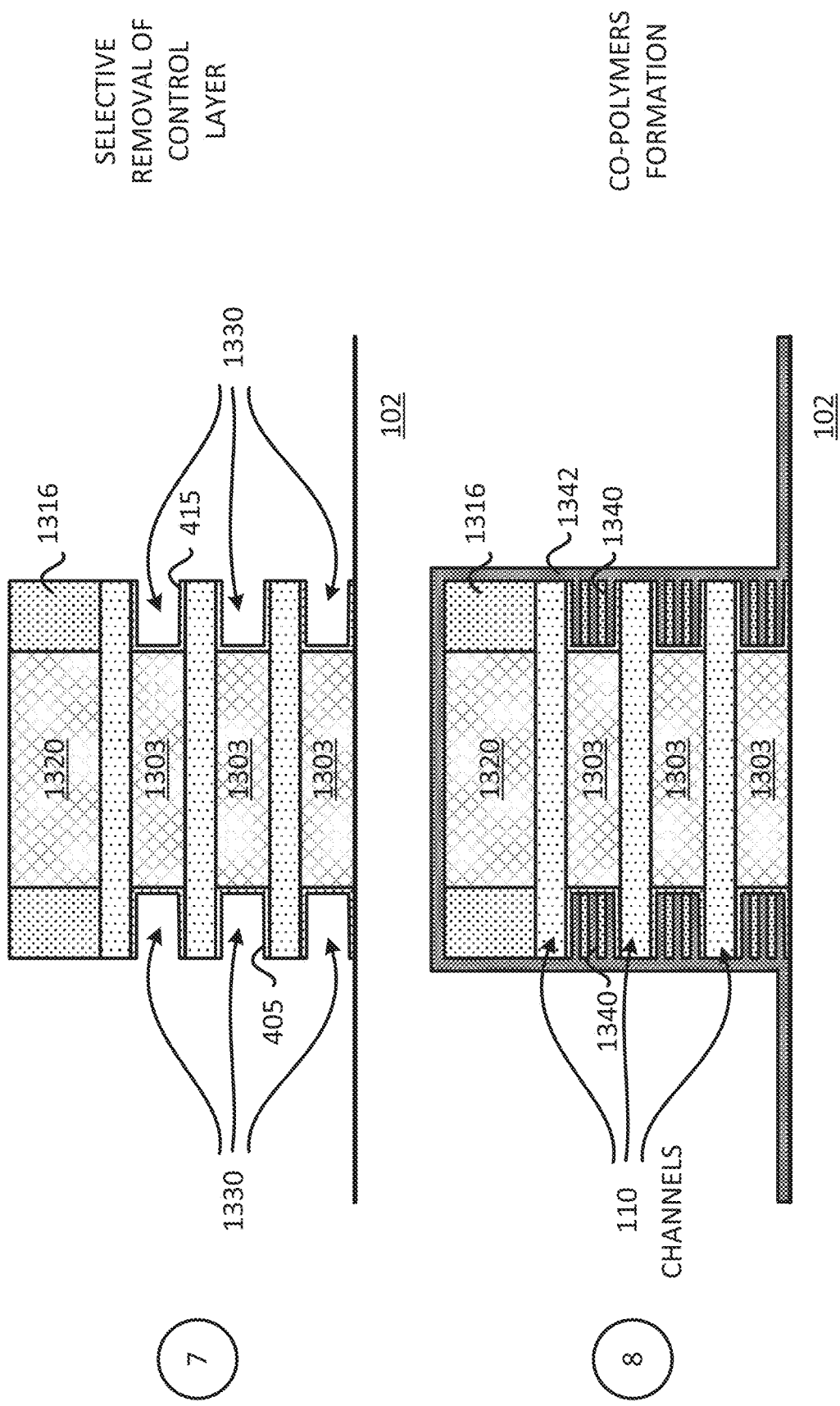

Stage 7, as shown in FIG. 13D, illustrates a state after selective removal of the control layer 1315. An etching process may be used to remove portions of the control layer 1315. Outside portions of the control layer 1315 may be removed. For example, portions of the control layer 1315 over the substrate 102, the dummy gate and spacer 1316 may be removed. The control layer 1315 may remain in the cavities 1330. The remaining control layer may be the control layer 405 and the control layer 415. The control layer 405 and/or the control layer 415 may be an alignment control layer.

Stage 8 illustrates a state after copolymers are formed in the cavities 1330. The copolymers may include a first polymer 1340 and a second polymer 1342. Forming the copolymers may include using directed self-assembly of block copolymers (BCPs). An example of block copolymers includes poly(styrene-block-methyl methacrylate) (PS-b-PMMA) (PS-PMMA). Some of the materials may be non-etchable (e.g., polystyrene (PS)) and some of the materials may be etchable (e.g., poly(methyl methacrylate) (PMMA)). Forming the copolymers may include epitaxial self-assembly. Forming the copolymers may include graphoepitaxy. Forming copolymers may include performing pattern resist, switching resist polarity, coating a neutral layer, performing lift off, coating the block copolymers and annealing. The first polymer 1340 is different from the second polymer 1342. The first polymer 1340 may include a non-etchable phase material (e.g., PS), and the second polymer 1342 may include an etchable phase material (e.g., PMMA). Different implementations may use different arrangements and/or combinations of the first polymer 1340 and the second polymer 1342. The use of the control layers 405 and 415 (which is from the control layer 1315) helps the first polymer 1340 and the second polymer 1342 self-align in the cavities 1330, such that alternating rows of the first polymer 1340 and the second polymer 1342 are formed in the cavities 1330. Different implementations may use different epitaxial self-assembly processes.

Stage 9, as shown in FIG. 13E, illustrates a state after the second polymer 1342 is removed (e.g., etched) leaving the first polymer 1340. An isotropic etch may be used to remove the second polymer 1342 (e.g., PMMA). After the etching, the plurality of inner spacers (e.g., 107, 117) and the plurality of voids (e.g., 109, 119) may be formed. The plurality of inner spacers (e.g., 107, 117) may include the first polymer 1340 (e.g., PS). Different implementations remove different polymer layers. The pattern of rows of inner spacers and voids (e.g., stacked inner spacer(s) and void(s)) may be configured based on the polymers that are used for the first polymer and the second polymer, and which polymer is subsequently removed.

Stage 10 illustrates a state after source and drain formation. After source and drain formation, a source and a drain are formed over the substrate 102. For example, a source 104 and a drain 106 are disposed over the substrate 102. An epitaxial process may be used to form the source and the drain. It is noted that without the inner spacers 107 and 117, the source 104 and the drain 106 may be formed in the cavities 1330. This in turn, may cause the source 104 and the drain 106 to be too close together, which can cause unintentional electrical coupling of the source 104 and the drain 106. While there are voids 109 and 119, the height of the voids is so small (or the vertical spacing between the inner spacers are so small) that the source 104 and the drain 106 do not form substantially in the voids 109 and 119.

Stage 10 may also illustrate a state after doping of the source and the drain. The source 104 and the drain 106 may be doped with either an N type dopant (N+) or a P type dopant (P+). Doping the source 104 and the drain 106 with a N type dopant (N+) may produce a source 104 and a drain 106 for a NMOS. Doping the source 104 and the drain 106 with a P type dopant (P+) may produce a source 104 and a drain 106 for a PMOS. Vapor phase epitaxy may be used to dope the source and the drain. However, different implementations may use different processes for doping the source and the drain. The plurality of inner spacers (e.g., 107, 117) helps prevent the source 104 and the drain 106 from being substantially formed in the cavities 1330, which would cause the source 104 and the drain 106 to be much closer to each other. That is, if there was no plurality of inner spacers 107 and 117, during the formation of the source 104 and the drain 106, the source 104 and the drain 106 would form substantially in the cavities 1330, resulting in the source 104 and the drain 106 to be too close to each other. However, as mentioned above, even though there are voids 109 and 119, the voids 109 and 119 are so thin that the source 104 and the drain 106 are not substantially formed inside of the voids 109 and 119. For example, less than 10% of the voids 109 and 119 may be filled with the source 104 and/or the drain 106.

Figure 13F:
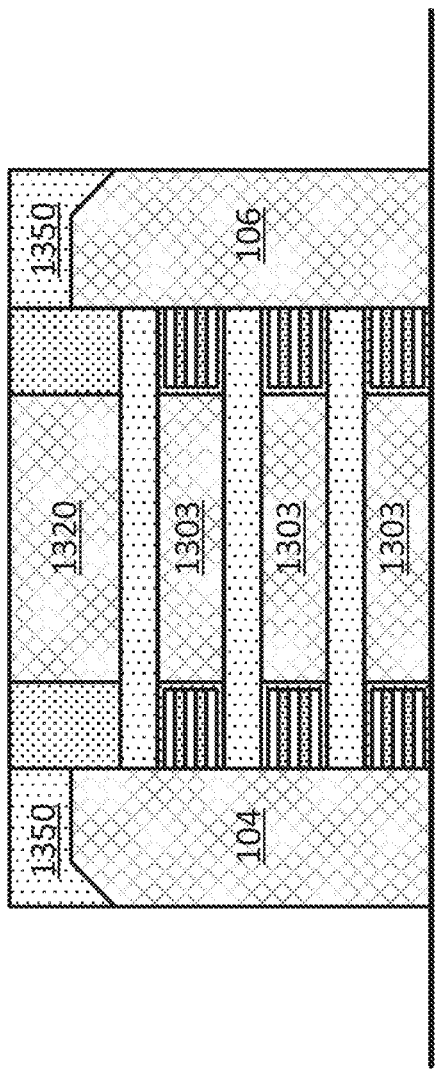
Figure 13F:
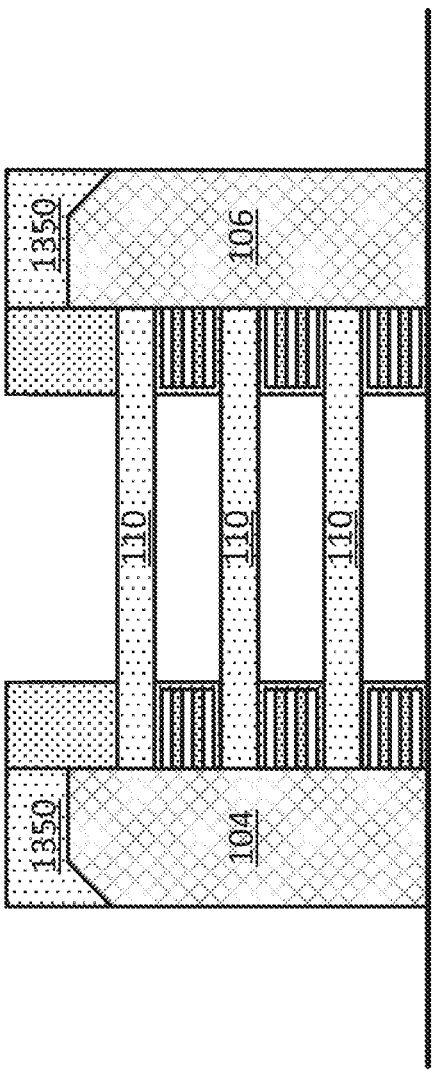

Stage 11, as shown in FIG. 13F, illustrates a state after dielectric formation (e.g., interlevel dielectric (ILD) formation). A dielectric layer 1350 may be formed over the source 104 and the drain 106. An oxide layer may be formed over the source 104 and the drain 106 before forming the dielectric layer 1350. A chemical, mechanical planarization (CMP) process may be performed on the dielectric layer 1350, the gate 1320 and/or the spacer 1316.

Stage 12 illustrates a state after dummy gate and dummy dielectric layer removal, where the dummy gate 1320 and the SiGe layers 1303 are removed. An etching process may be used to remove the dummy gate 1320 and the SiGe layers 1303.

Figure 13G:
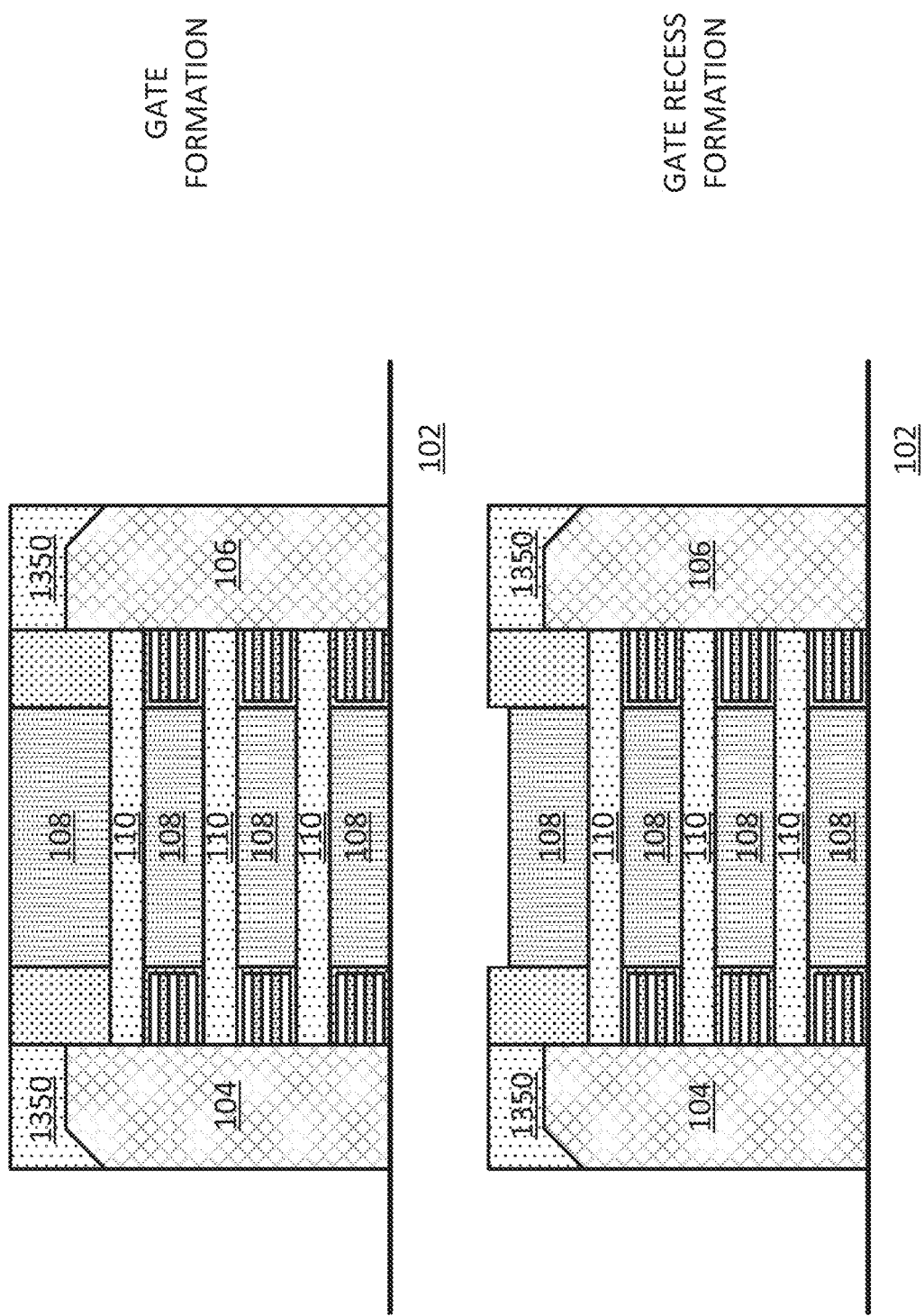

Stage 13, as shown in FIG. 13G, illustrates a state after gate formation, where the gate 108 is formed. The gate 108 may be formed where the dummy gate 1320 and the SiGe layers 1303 were previously located. The gate 108 may include high K metal gate (HKMG). A deposition process and/or a plating process may be used to form the gate 108. For example, a deposition process may be used to form a high K dielectric layer, and at least one deposition process may be used to form one or more metal layers to form the gate 108. The one or more metal layers may include one or more different metal materials. A chemical, mechanical planarization (CMP) process may be performed on the gate 108. The gate 108 may surround the plurality of channels 110. The gate 108 may be formed between the source 104 and the drain 106. The gate 108 may be formed between the plurality of inner spacers 107 and the plurality of inner spacers 117. The gate 108 may be formed between the plurality of voids 109 and the plurality of voids 119.

Stage 14 illustrates a state after a gate recess formation, where portions of the gate 108 is removed. An etching process may be performed on the gate 108 (e.g., on a top portion of the gate).

Figure 13H:
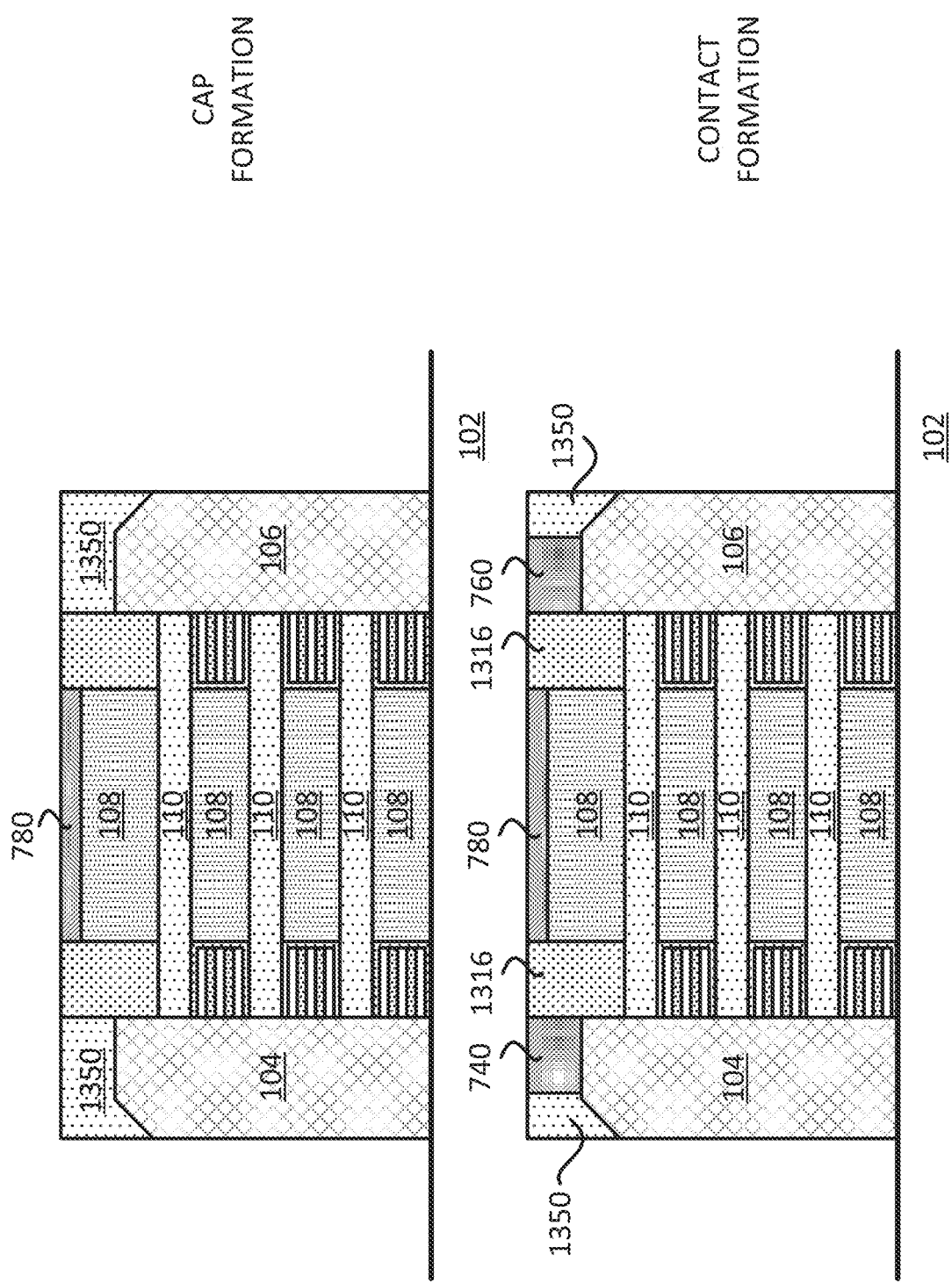

Stage 15, as shown in FIG. 13H, illustrates a state after a gate cap 780 is formed over the gate 108. A deposition process may be used to form the gate cap 780 over the gate 108. The gate cap 780 may include a dielectric. For example, the gate cap 780 may include silicon nitride (SiN).

Stage 16 illustrates a state after a source contact 740 is formed over the source 104, and a drain contact 760 is formed over the drain 106. Cavities may be formed (e.g., through patterning and etching) in the dielectric layer 1350 and the source contact 740 and the drain contact 760 may be formed in the dielectric layer 1350. A deposition process and/or a plating process may be used to form the source contact 740 and the drain contact 760. The spacers 1316 may represent the outer spacer 727 and the outer spacer 737, as described in FIG. 8. Stage 16 may represent the transistor 800 of FIG. 8. However, the processes described above may be used to fabricate the transistor 700 of FIG. 7.

Figure 13I:
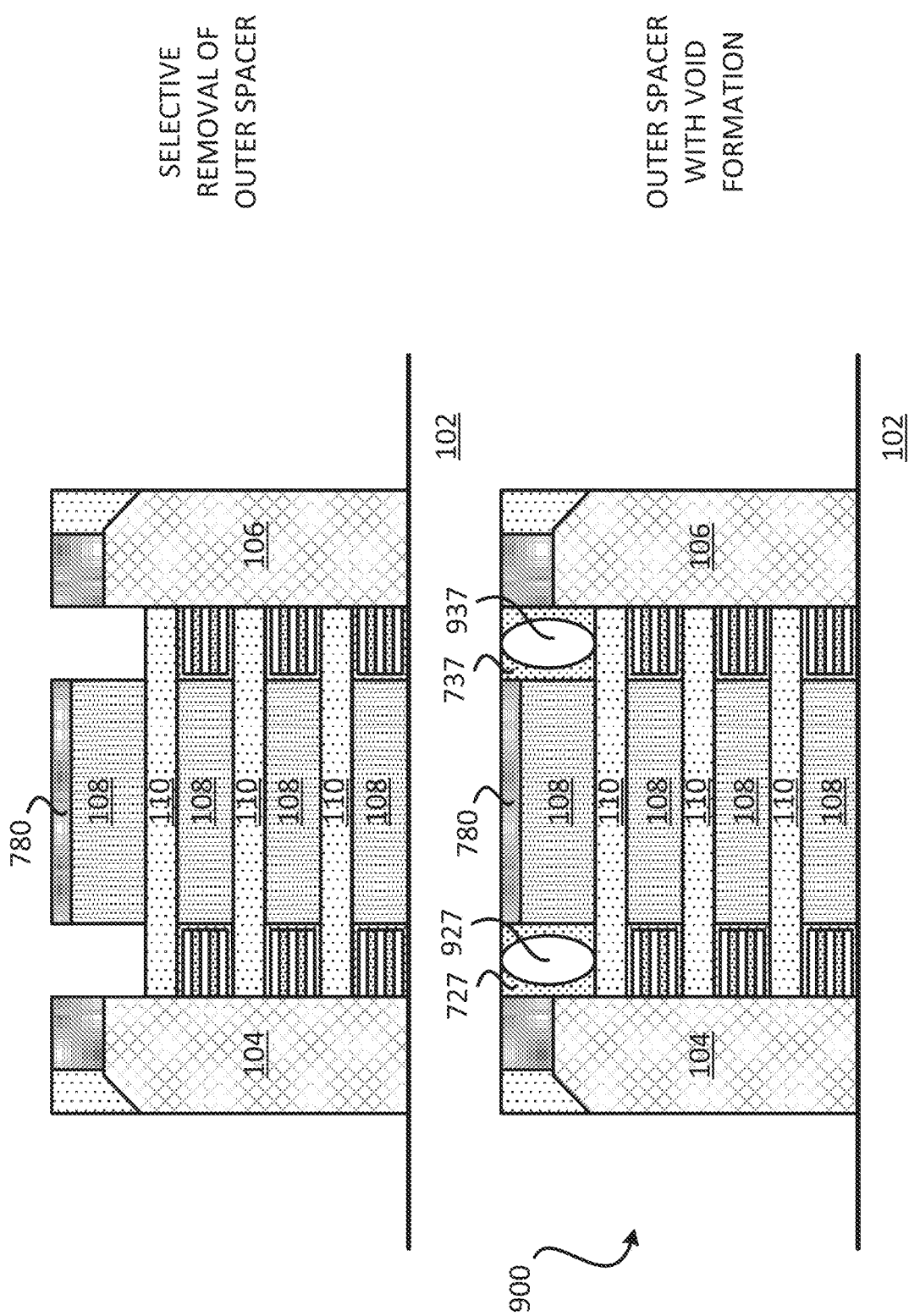

Stage 17, as shown in FIG. 13I, illustrates a state after the spacer 1316 is removed. The spacer 1316 may be selectively removed through an etching process.

Stage 18, illustrates a state after forming the outer spacers 727 and 737, with voids 927 and 937. The outer spacers 727 and 737 and voids 927 and 937, may be formed using non-conformal dielectric deposition to pinch-off. Stage 18 may represent the transistor 1000 of FIG. 10. However, the processes described above may be used to fabricate the transistor 900 of FIG. 9. In some implementations, additional processes may be performed on the transistor, including a polishing process.

Figure 14:
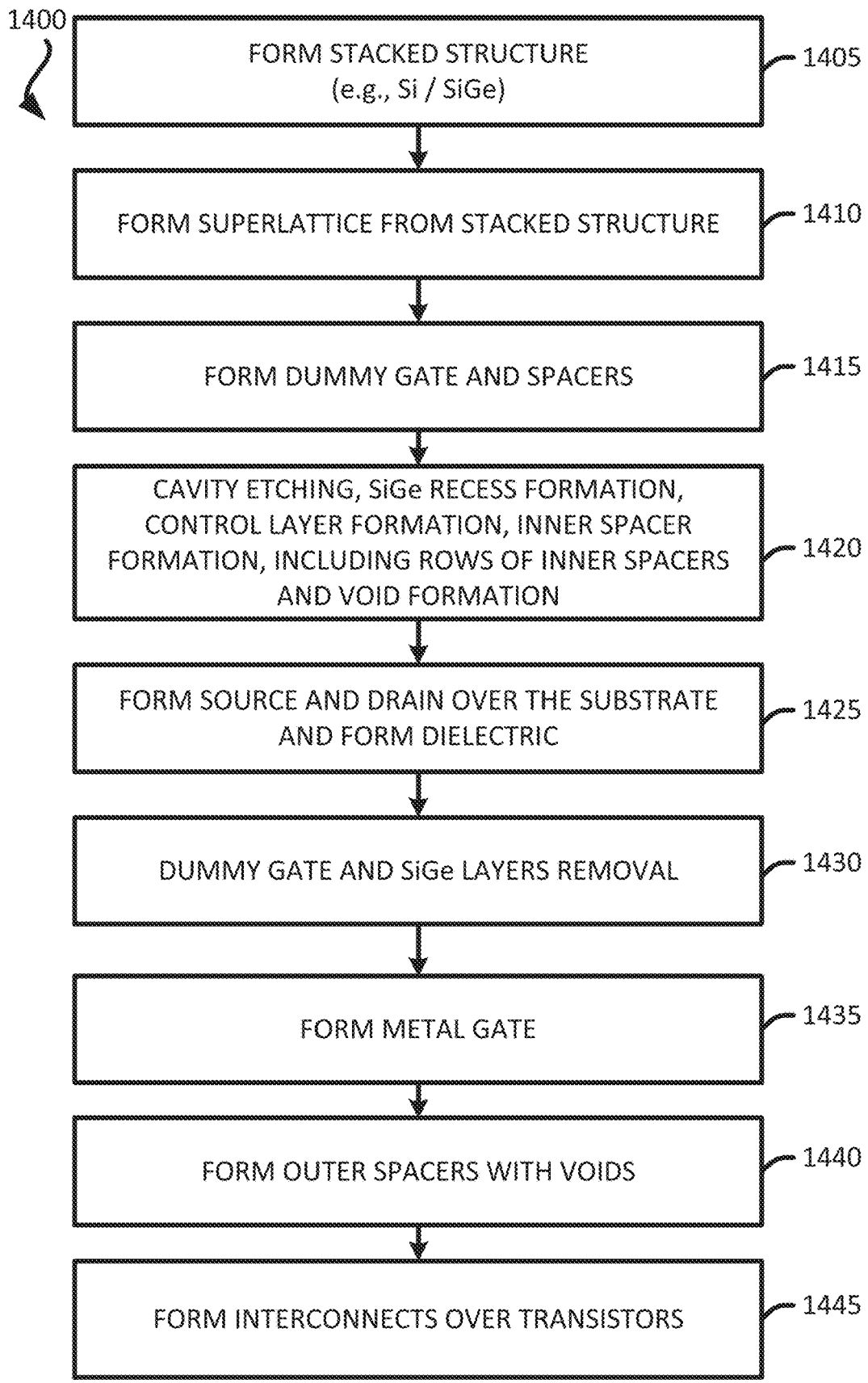
FIG. 14 illustrates an exemplary flow diagram of a method for fabricating a gate-all-around GAA FET.

Exemplary Flow Diagram of a Method for Fabricating a Transistor that Includes Inner Spacers and Voids Between Channels In some implementations, fabricating a transistor includes several processes. FIG. 14 illustrates an exemplary flow diagram of a method 1400 for providing or fabricating a transistor (e.g., NMOS transistor a PMOS transistor) The transistor may be part of transistors that form a CMOS structure. In some implementations, the method 1400 of FIG. 14 may be used to provide or fabricate the transistor of FIG. 1-12 and/or other transistors described in the present disclosure.

It should be noted that the sequence of FIG. 14 may combine one or more processes in order to simplify and/or clarify the method for providing or fabricating a transistor. In some implementations, the order of the processes may be changed or modified.

The method forms (at 1405) a stacked structure of alternating layers of silicon (Si) and silicon germanium (SiGe). The stacked structure may be formed over the substrate 102. Different implementations may provide different materials for the substrate 102. In some implementations, the substrate 102 may include silicon (Si). The substrate 102 may include a P substrate or a N substrate. In some implementations, the substrate 102 is not doped. The substrate 102 may include wells (e.g., N well, P well). Stage 1 of FIG. 13A illustrates and describes an example of providing a substrate.

The method forms (at 1410) superlattices (e.g., 1301) from the stacked structure. The superlattices may be formed by removing (e.g., etching) portions of the stacked structure. The process of forming the superlattice may include forming a shallow trench isolation (STI) around the superlattice 1301, and exposing the superlattice 1301 by removing portions of the STI. Stage 2 of FIG. 13A illustrates and describes an example of forming a superlattice that includes alternating layers of Si and SiGe.

The method forms (at 1415) a dummy gate (e.g., 1320) and a spacer (e.g., 1316) over the superlattice 1301. The spacers 1316 are formed over the superlattice 1301 and next to (and on each side of) the dummy gate 1320. It is noted that the spacer 1316 is exemplary. In some implementations, the spacer 1316 may be the spacers 727 and 737, or any of the spacers described in the disclosure. Stage 3 of FIG. 13B illustrates and describes an example dummy gate and spacer formation.

The method performs (at 1420) cavity etching, SiGe recess, control layer formation, inner spacer and void formation. During cavity etching, portions of the superlattice 1301 not covered by the dummy gate 1320 and/or the spacer 1316 are removed. Cavity etching includes removing portions of the Si layers 1302 and the portions of the SiGe layers 1303 of the superlattice 1301 Stage 4 of FIG. 13B illustrates an example of cavity etching of the Si layers 1302 and the SiGe layers 1303. The remaining Si layer 1302 may form the basis for a plurality of channels 110. Stage 4 of FIG. 13B illustrates and describes an example of cavity etching.

During SiGe recess, portions of the SiGe layers 1303 underneath the spacer 1316 may be removed. Stage 5 of FIG. 13C illustrates and describes an example of SiGe recess. As mentioned above, SiGe recess may be formed during a same process a removing the Si layers 1302 and SiGe layers 1303, as described in Stage 4 of FIG. 13B.

During control layer formation, at least one control layer (e.g., 1315) may be formed over surfaces of the dummy gate 1320, the spacer 1316, the plurality of channels 110, the SiGe layers 1303 and the substrate 102. A deposition process may be used to form the control layer 1315. The control layer 1315 may include carbon and/or polymer. For example, the control layer 1315 may include carbon that includes a polymer material. The method may further selectively remove portions of the control layer 1315 that has been formed. For example, the method may remove the portions of the control layer 1315 such that the control layer 1315 may be found in the cavities 1330. Stages 6 and 7 of FIGS. 13C and 13D illustrate and describe examples of control layer formation.

During inner spacer and void formation, the method may form co-polymers in the cavities 1330 and over surfaces of the substrate 102, the plurality of channels 110, the spacer 1316 and the dummy gate 1320. The co-polymers that are formed may include a first polymer 1340 and a second polymer 1342. The first polymer 1340 may include a non-etchable phase material (e.g., PS), and the second polymer 1342 may include an etchable phase material (e.g., PMMA). Different implementations may use different arrangements and/or combinations of the first polymer 1340 and the second polymer 1342. The use of the control layers 405 and 415 (which is from the control layer 1315) helps the first polymer 1340 and the second polymer 1342 self-align in the cavities 1330, such that alternating layers of the first polymer 1340 and the second polymer 1342 are formed in the cavities 1330.

Once the co-polymers are formed, an etching process may be formed to remove one of the co-polymers. For example, the second polymer 1342 may be etchable and thus may be removed, while the first polymer 1340 may not be etchable. In one example, removing the second polymer 1342 leaves behind the first polymer 1340 in the cavities 1330. The remaining first polymer 1340 may define the plurality of inner spacers 107 and 117. Moreover, removing the second polymer 1342 creates the plurality of voids 109 and 119. It is noted that different materials, different arrangements and/or different processes may be used to specific which polymer to remove to specify how the inner spacers and voids are formed. Stages 8 and 9 of FIG. 13D and FIG. 13E illustrate and describe examples of forming inner spacers and voids.

The method forms (at 1425) a source and drain, and performs dielectric formation. Forming the source and the drain may include disposing (e.g., forming) a source 104 and a drain 106 over the substrate 102 (and/or the wells). Forming the source and the drain may also include doping the source and the drain. For example, the source 104 and the drain 106 may be doped with either an N type dopant (N+) or a P type dopant (P+). Dielectric formation may include forming a dielectric layer 1350 over the source 104, the drain 106 and the spacer 316. Stages 10 and 11 of FIGS. 13E and 13F illustrate and describe examples of source, drain and dielectric formation.

The method performs (at 1430) dummy gate removal, where the dummy gate 1320 and the SiGe layers 1303 are removed, exposing portions of the channels 110. One or more etching processes may be used to remove the dummy gate 1320 and the SiGe layer(s) 1303. Stage 12 of FIG. 13F illustrates and describes an example of dummy gate removal and SiGe layer removal.

The method performs (at 1435) gate formation. Gate formation may include forming a gate 108 around the plurality of channels 110. Gate formation may include forming a metal around the plurality of channels 110. Gate formation may include forming a high K dielectric layer and a metal layer formation. The gate 108 may include TiN. The gate formation may include forming a cap over the gate. Once the gate is formed, contacts may be formed over the source and drain. Stages 13-16 of FIGS. 13G and 13H illustrate and describe examples of gate formation, gate cap formation, and contact formation.

The method forms (at 1440) outer spacers having voids. Forming the outer spacers may include selectively removing the spacers 1316, and forming the outer spacers 727 and 737 that includes voids 927 and 937. Stages 17 and 18 of FIG. 13I illustrate and describe examples of outer spacers with voids formation.

Figure 16B:
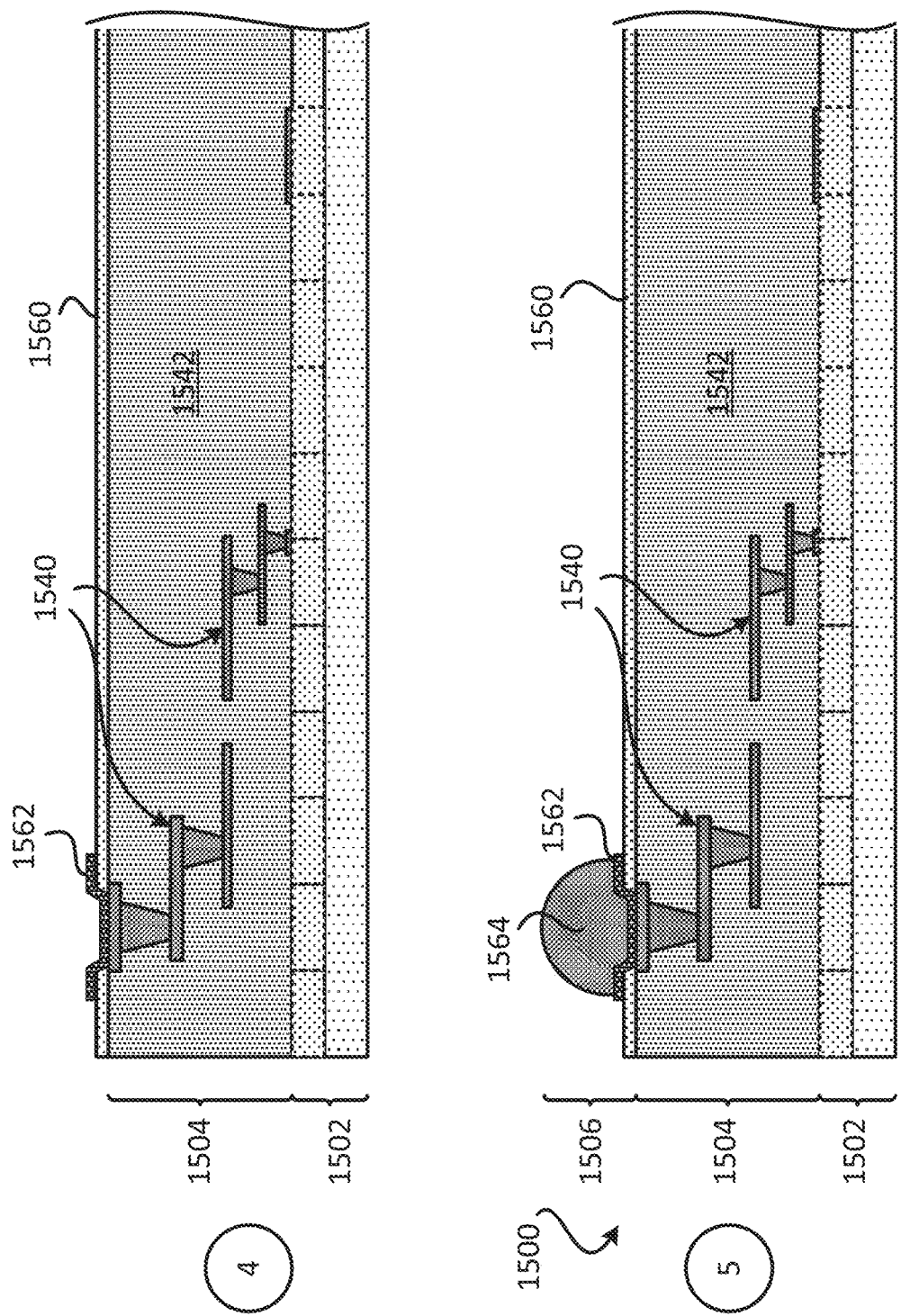

The method forms (at 1445) interconnects above the transistors. The interconnects may be coupled (e.g., directly or indirectly) to the gate 108, the source 104 and/or the drain 106. Interconnect may include source contact, drain contact, gate contact, and interconnect on a M1 layer. FIGS. 16A-16B illustrate and describe an example of forming interconnects above the transistors.

Figure 15:
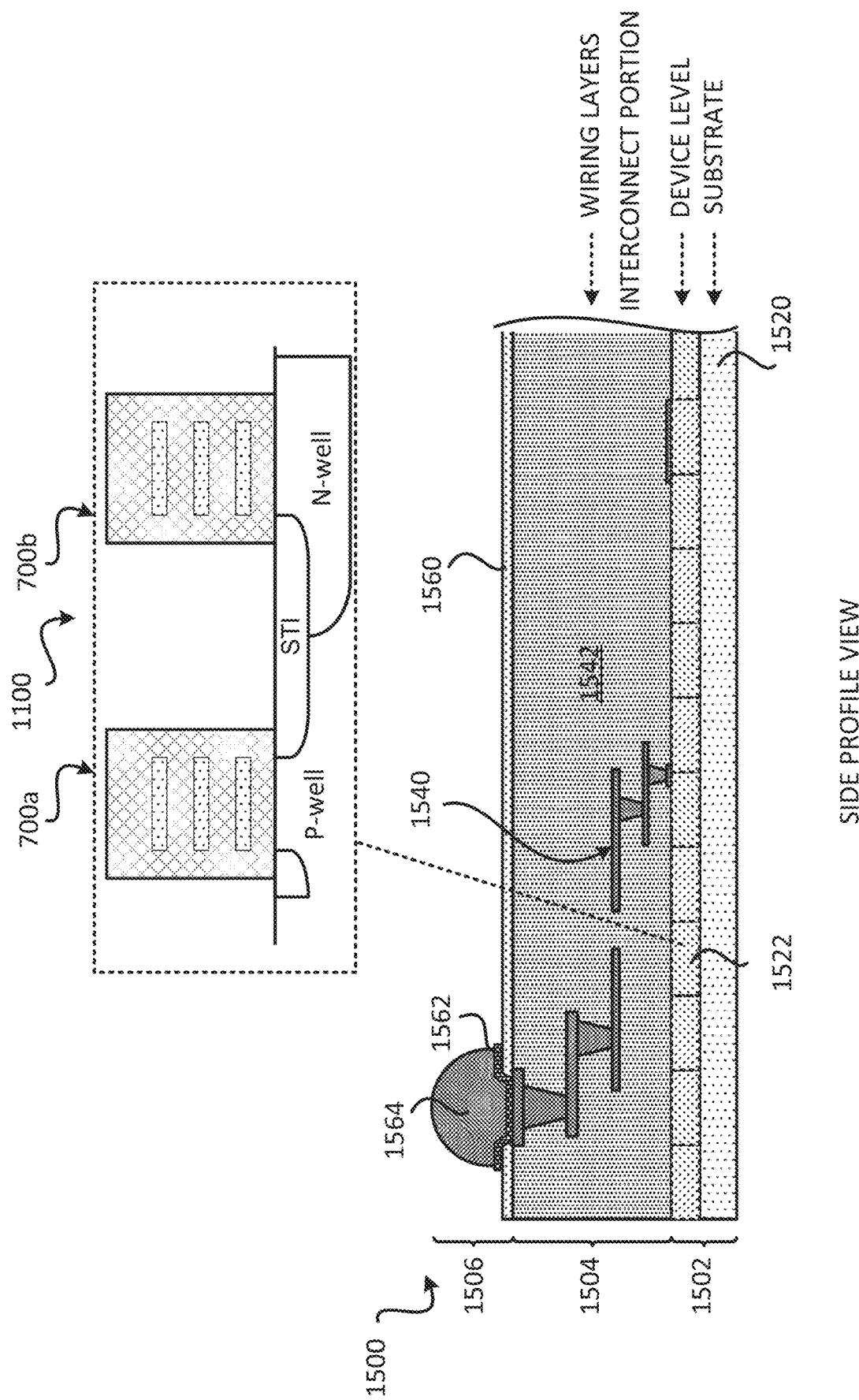
FIG. 15 illustrates a profile view of an integrated device that includes gate-all-around (GAA) FETs.

Exemplary Integrated Device Comprising a Transistor that Includes Inner Spacers and Voids Between Channels FIG. 15 illustrates a profile view of an integrated device 1500 that includes one or more transistors comprising multiples inner spacers and voids between channels. The integrated device 1500 includes a substrate 1520, a plurality of device level cells 1522 (e.g., logic cells), interconnect portion 1504, and a packaging portion 1506. The plurality of device level cells 1522 is formed over the substrate 1520. The plurality of device level cells 1522 may form the device level layer of the integrated device 1500. In some implementations, the plurality of device level cells 1522 may include portions of the substrate 1520. In some implementations, the substrate 1520 and the plurality of device level cells 1522 may be referred as the substrate portion 1502 of the integrated device 1500.

The plurality of device level cells 1522 may include a NMOS transistor, a PMOS transistor and/or a CMOS structure, where at least one transistor includes multiples inner spacers and voids between channels. The plurality of device level cells 1522 may include the cell 600 as described in FIG. 6. As shown in FIG. 15, one of the device level cells includes a structure 1100 (e.g., CMOS structure) that includes the NMOS transistor 700a and the PMOS transistor 700b. The NMOS transistor 700a and/or the PMOS transistor 700b may each include multiples inner spacers and voids between channels.

In some implementations, the NMOS transistor 700a may be a first transistor (e.g., means for first transistor) formed over the substrate 1520. In some implementations, the transistor 700a may include a source 104 (e.g., first source) disposed over the substrate 1520; a drain 106 (e.g., first drain) disposed over the substrate 1520; a plurality of channels 110 (e.g., first plurality of channels) coupled to the source 104 and the drain 106. The plurality of channels 110 is located between the source 104 and the drain 106. The transistor 700a may include a plurality of inner spacers (e.g., 107, 117) and voids (e.g., 109, 119). The transistor 700a may include a first gate (e.g., 108, 1208) surrounding the plurality of channels 110.

In some implementations, the PMOS transistor 700b may be a second transistor (e.g., means for second transistor) formed over the substrate 1520. In some implementations, the transistor 700b may include a source 104 (e.g., second source) disposed over the substrate 1520; a drain 106 (e.g., second drain) disposed over the substrate 1520; a plurality of channels 110 (e.g., second plurality of channels) coupled to the source 104 and the drain 106. The plurality of channels 110 is located between the source 104 and the drain 106. The transistor 700b may include a plurality of inner spacers (e.g., 107, 117) and voids (e.g., 109, 119). The transistor 700b may include a second gate (e.g., 108, 1208) surrounding the plurality of channels 110. In some implementations, the transistor 700a and the transistor 700b may share the same gate.

Different implementations may have different numbers and/or arrangements of CMOS structures, NMOS transistors and/or PMOS transistors. The structure 1100 may be the CMOS structure 601b. It is noted that the integrated device 1500 may include other types of structures, such as the structure 1200 of FIG. 12.

The interconnect portion 1504 is formed over the substrate portion 1502. In particular, the interconnect portion 1504 is formed over the plurality of device level cells 1522. The interconnect portion 1504 includes wiring layers (e.g., M1-M10 layers). The interconnect portion 1504 includes a plurality of interconnects 1540 (e.g., trace, pad, vias) and at least one dielectric layer 1542. The interconnect portion 1504 may provide interconnect between the plurality of CMOS structures, NMOS transistors and/or PMOS transistors. Interconnects from an M1 layer of the interconnect portion 1504 may be coupled to a gate contact, a drain contact and a source contact of at least one transistor.

A packaging portion 1506 is formed over the interconnect portion 1504. The packaging portion 1506 includes a passivation layer 1560, an under bump metallization (UBM) layer 1562 and a solder interconnect 1564. It is noted that the size and shape of the integrated device 1500 is exemplary. Moreover, the components of the integrated device 1500 shown may not be to scale.

Exemplary Sequence for Fabricating an Integrated Device Comprising a Transistor that Includes Inner Spacers and Voids Between Channels In some implementations, fabricating an integrated device that includes a transistor includes several processes. FIGS. 16A-16B illustrate an exemplary sequence for providing or fabricating an integrated device that includes a NMOS transistor and a PMOS transistor. In some implementations, the sequence of FIGS. 16A-16B may be used to provide or fabricate the integrated device of FIG. 15 and/or other integrated devices described in the present disclosure.

It should be noted that the sequence of FIGS. 16A-16B may combine one or more stages in order to simplify and/or clarify the sequence for providing or fabricating an integrated device that includes a NMOS transistor and a PMOS transistor. In some implementations, the order of the processes may be changed or modified. In some implementations, one or more of processes may be replaced or substituted without departing from the spirit of the disclosure.

Stage 1, as shown in FIG. 16A, illustrates a state after a substrate 1520 is provided. Different implementations may provide different materials for the substrate 1520. In some implementations, the substrate 1520 may include silicon (Si). The substrate may include wells (e.g., N well, P well).

Stage 2 illustrates a state after the device level layer is formed over the substrate 1520. The device level layer includes the plurality of device level cells 1522 (e.g., 600). Thus, Stage 2 illustrates a state after the plurality of device level cells 1522 is formed over the substrate 1520. In some implementations, a front end of line (FEOL) process may be used to fabricate the device level layer (e.g., plurality of device level cells 1522). One or more of cells from the plurality of device level cells may include a NMOS transistor and/or a PMOS transistor, as described above. One or more of the transistors may include inner spacers (e.g., 107, 117) and voids (e.g., 109, 119). FIGS. 13A-13I illustrate a sequence for fabricating a transistor (e.g., NMOS transistor, a PMOS transistor). In some implementations, interconnects (e.g., contacts) may be formed (e.g., directly or indirectly coupling) over the gate, source and/or drain of one or more transistors.

Stage 3 illustrates a state after the interconnect portion 1504 is formed. The interconnect portion 1504 may include plurality of interconnects 1540 and at least one dielectric layer 1542. In some implementations, a back end of line (BEOL) process may be used to fabricate interconnect portion 1504. The interconnect portion 1504 may be configured to electrically couple one or more NMOS transistors, one or more PMOS transistors, one or more CMOS structures having a NMOS transistor and a PMOS transistor. Interconnects from the interconnect portion 1504 may be coupled to contacts (e.g., source contact, drain contact, gate contact) of at least one transistor.

Stage 4, as shown in FIG. 16B, illustrates a state after a passivation layer 1560 and the UBM layer 1562 are formed over the interconnect portion 1504. A deposition process may be used to form the passivation layer 1560.

Stage 5 illustrates a state after a solder interconnect is coupled to the UBM layer 1562. Stage 15 may illustrate the integrated device 1500 of FIG. 15.

Figure 17:
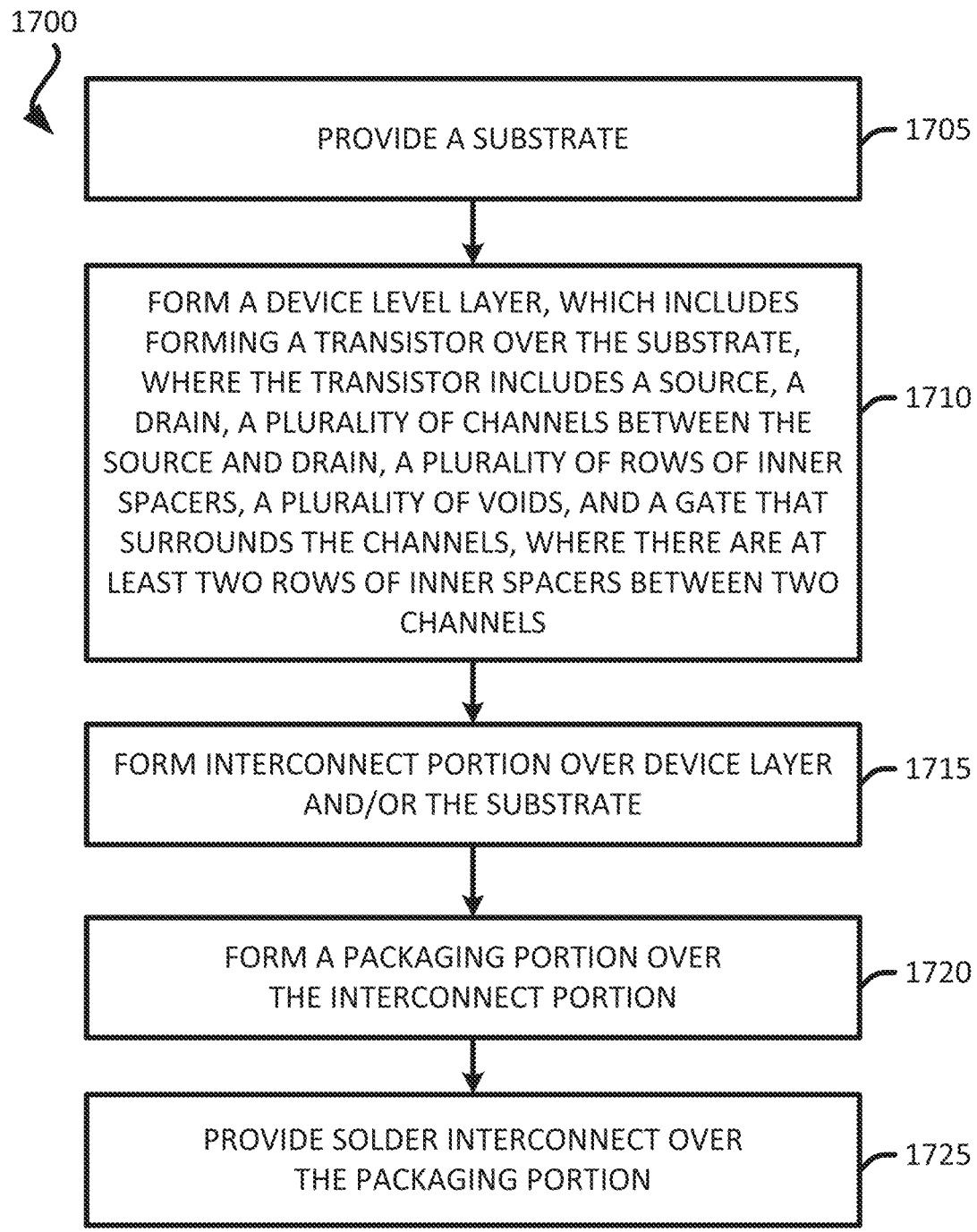
FIG. 17 illustrates an exemplary flow diagram of a method for fabricating an integrated device that includes gate-all-around (GAA) FETs.

Exemplary Flow Diagram of a Method for Fabricating an Integrated Device Comprising a Transistor that Includes Inner Spacers and Voids Between Channels In some implementations, providing an integrated device that includes a transistor includes several processes. FIG. 17 illustrates an exemplary flow diagram of a method 1700 for providing or fabricating an integrated device that includes a transistor. In some implementations, the method 1700 of FIG. 17 may be used to provide or fabricate the integrated device of FIG. 15 and/or other integrated devices described in the present disclosure.

It should be noted that the sequence of FIG. 17 may combine one or more processes in order to simplify and/or clarify the method for providing or fabricating an integrated device that includes a transistor comprising inner spacers and voids. In some implementations, the order of the processes may be changed or modified.

The method provides (at 1705) a substrate (e.g., 1520). Different implementations may provide different materials for the substrate. In some implementations, the substrate may include silicon (Si). The substrate may be doped with an N type dopant or a P type dopant. Providing the substrate may include forming wells (e.g., N well, P well) in the substrate.

The method forms (at 1710) a device level layer (e.g., the plurality of device level cells 1522) over the substrate. In some implementations, a FEOL process may be used to fabricate the device level layer (e.g., plurality of device level cells 1522). The device level layer may include a plurality of device level cells (e.g., 600). The device level cells may include one or more active devices (e.g., transistor). One or more device level cells may include a structure having a NMOS transistor and/or a PMOS transistor, as described in the disclosure. Forming the device level layer may include forming one or more NMOS transistors (e.g., 700a) and/or one or more PMOS transistors (e.g., 700b), where the transistors includes several inner spacers and voids between adjacent channels and/or between a substrate and an adjacent channel. As mentioned above the NMOS transistors and/or the PMOS transistors may be gate all around (GAA) transistors. In some implementations, forming a device level layer includes forming a first transistor over the substrate. Forming the first transistor may include forming a first plurality of channels, forming at least one row inner spacer (e.g., one layer of inner spacer) between two adjacent channels from the first plurality of channels, such that there are at least two voids between the two adjacent channels from the first plurality of channels, forming a first source over the substrate, forming a first drain over the substrate, and forming a first gate surrounding the first plurality of channels. FIGS. 13A-13I illustrate an example of forming a transistor over a substrate.

The method forms (at 1715) an interconnect portion 1504 over the device level layer (e.g., plurality of device level cells 1522) and/or the substrate 1520. The interconnect portion 1504 may include a plurality of interconnect 1540 and at least one dielectric layer 1542. In some implementations, a BEOL process may be used to form the interconnect portion 1504. The interconnect portion 1504 may be configured to electrically couple one or more transistors, and/or one or more CMOS structures having a NMOS transistor and a PMOS transistor.

The method forms (at 1720) a packaging portion 1506 over the interconnect portion 1504. The packaging portion 1506 may include the passivation layer 1560 and the UBM layer 1562. The passivation layer 1560 and the UBM layer 1562 are formed over the interconnect portion 1504.

The method provides (at 1725) a solder interconnect 1564. In some implementations, the solder interconnect 1564 is coupled to the UBM layer 1562

It is also noted that the method 1700 of FIG. 17 may be used to fabricate (e.g., concurrently fabricate) several integrated devices on a wafer. The wafer is then singulated (e.g., cut) into individual integrated devices. These singulated integrated devices may then be coupled to other integrated devices and/or printed circuit boards (PCBs).

Exemplary Electronic Devices

Figure 18:
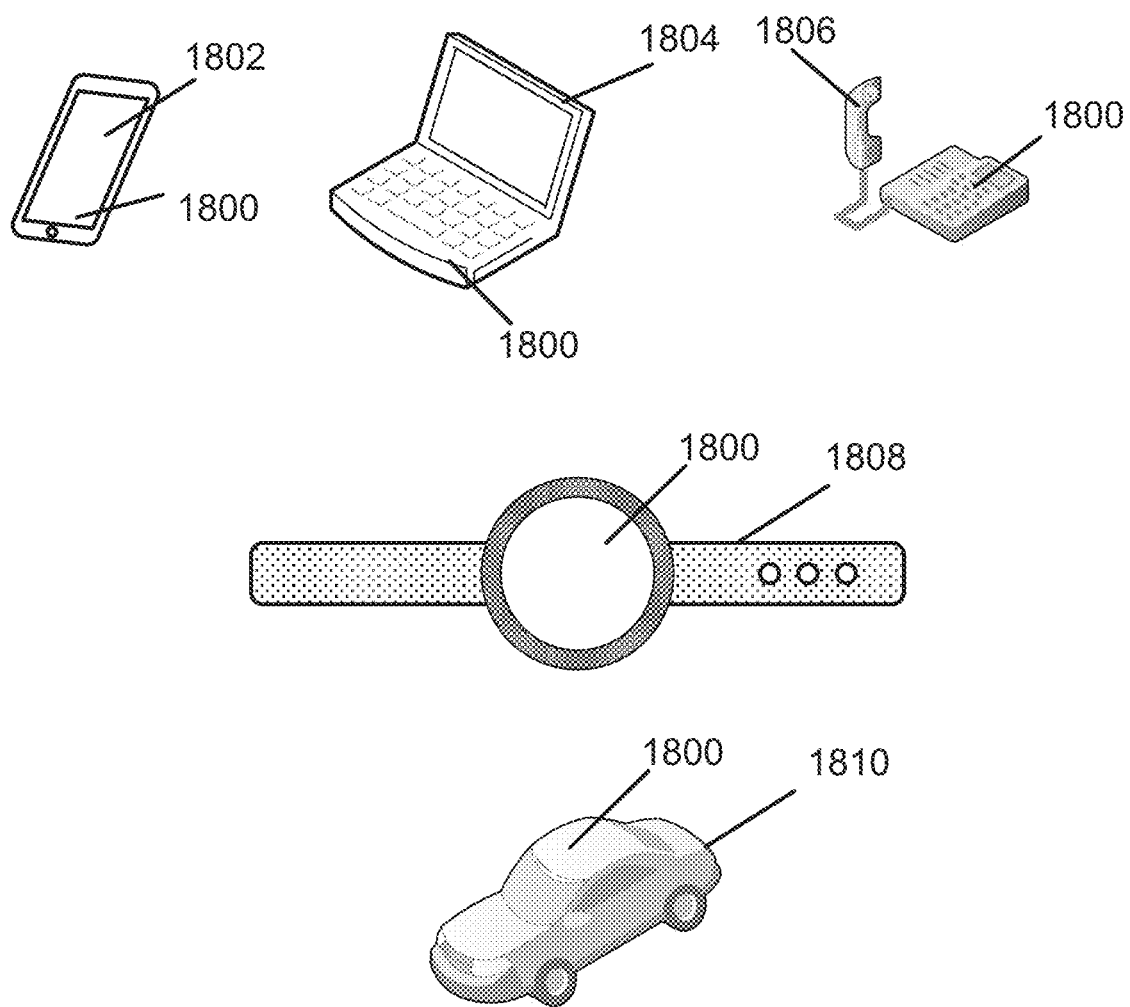
FIG. 18 illustrates various electronic devices that may integrate a die, an integrated device, an integrated passive device (IPD), a device package, a package, an integrated circuit and/or printed circuit board (PCB) described herein.

FIG. 18 illustrates various electronic devices that may be integrated with any of the aforementioned transistor, CMOS, NMOS transistor, PMOS transistor, device, integrated device, integrated circuit (IC) package, integrated circuit (IC) device, semiconductor device, integrated circuit, die, interposer, package or package-on-package (PoP). For example, a mobile phone device 1802, a laptop computer device 1804, a fixed location terminal device 1806, a wearable device 1808, and/or a vehicle 1810 may include a device 1800 as described herein. The device 1800 may be, for example, any of the devices and/or integrated circuit (IC) packages described herein. The devices 1802, 1804, 1806, 1808 and vehicle 1810 illustrated in FIG. 18 are merely exemplary. Other electronic devices may also feature the device 1800 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-12, 13A-13I, 14, 15, 16A-16B and/or 17-18 may be rearranged and/or combined into a single component, process, feature or function or embodied in several components, processes, or functions. Additional elements, components, processes, and/or functions may also be added without departing from the disclosure. It should also be noted FIGS. 1-12, 13A-13I, 14, 15, 16A-16B and/or 17-18 and its corresponding description in the present disclosure is not limited to dies and/or ICs. In some implementations, FIGS. 1-12, 13A-13I, 14, 15, 16A-16B and/or 17-18 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first, second, third or fourth. For example, a component that is referred to a second component, may be the first component, the second component, the third component or the fourth component. The term "encapsulating" means that the object may partially encapsulate or completely encapsulate another object. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may be configured to provide an electrical path for a signal (e.g., a data signal), ground and/or power. An interconnect may include more than one element or component. An interconnect may be defined by one or more interconnects. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

In the following, further examples are described to facilitate the understanding of the invention.

In one further example, an integrated device is described. The integrated device includes a substrate and a first transistor formed over the substrate. The first transistor includes a first source disposed over the substrate, a first drain disposed over the substrate, at least one channel coupled to the first source and the first drain, where the at least one channel is located between the first source and the first drain; at least one inner spacer located between two adjacent channels from the at least one channel; at least one void located between the two adjacent channels; and a first gate surrounding the at least one channel. The at least one inner spacer may include (i) at least one source side inner spacer located between the first source and the first gate, and/or (ii) at least one drain side inner spacer located between the first drain and the first gate. The at least one void may include (i) at least one source side void located between the first source and the first gate, and/or (ii) at least one drain side void located between the first drain and the first gate.

Another example provides an apparatus that includes a substrate and means for first transistor formed over the substrate. The means for first transistor includes means for first source disposed over the substrate; means for first drain disposed over the substrate; means for first channeling coupled to the means for first source and the means for first drain, where the means for first channeling is located between the means for first source and the means for first drain; means for first inner spacing located between two adjacent channels from the means for first channeling; at least one void located between the two adjacent channels from the means for first channeling; and means for first gate surrounding the means for first channeling. The means for first inner spacing may include (i) at least one source side inner spacer located between the means for first source and the means for first gate, and/or (ii) at least one drain side inner spacer located between the means for first drain and the means for first gate. The at least one void may include (i) at least one source side void located between the means for first source and the means for first gate, and/or (ii) at least one drain side void located between the means for first drain and the means for first gate.

Another example provides an integrated device that includes a substrate and a first transistor formed over the substrate. The first transistor includes a first source disposed over the substrate, a first drain disposed over the substrate, at least one channel coupled to the first source and the first drain, where the at least one channel is located between the first source and the first drain; at least one inner spacer located between a first channel and the substrate, where the first channel is a channel from the at least one channel that is closest to the substrate; at least one void located between the first channel and the substrate; and a first gate surrounding the at least one channel. The at least one inner spacer may include (i) at least one source side inner spacer located between the first source and the first gate, and/or (ii) at least one drain side inner spacer located between the first drain and the first gate. The at least one void may include (i) at least one source side void located between the first source and the first gate, and/or (ii) at least one drain side void located between the first drain and the first gate.

Another example provides a method for fabricating an integrated device. The method provides a substrate. The method forms a first transistor over the substrate. Forming the first transistor includes forming at least one channel. Forming the first transistor includes forming at least one inner spacer between two adjacent channels from the at least one channel such that there are at least one void between the two adjacent channels from the at least one channel. Forming the first transistor includes forming a first source over the substrate. Forming the first transistor includes forming a first drain over the substrate. Forming the first transistor includes forming a first gate surrounding the at least one channel.

The invention claimed is:

1. An integrated device comprising:
a substrate; and
a first transistor formed over the substrate, the first transistor comprising:
a first source disposed over the substrate;
a first drain disposed over the substrate;
a first plurality of channels coupled to the first source and the first drain, wherein the first plurality of channels is located between the first source and the first drain;
at least one inner spacer located between two adjacent channels from the first plurality of channels
at least two voids located between the two adjacent channels, wherein the at least two voids touch the first source;
at least one source side inner spacer located between a first channel and the substrate, wherein the first channel is a channel from the first plurality of channels that is closest to the substrate;
at least two rows of source side voids located between the first channel and the substrate, wherein the at least two rows of source side voids touch the first source; and
a first gate surrounding the first plurality of channels.

2. The integrated device of claim 1, wherein the at least one inner spacer and the at least two voids are formed by alternating the at least one inner spacer and voids the void between the two adjacent channels.

3. The integrated device of claim 1, further comprising a control layer located between the first gate and the at least one inner spacer, wherein the at least two voids extend between the first source and the control layer.

4. The integrated device of claim 1, wherein each inner spacer has a thickness in a range of approximately 1-2 nanometers (nm).

5. The integrated device of claim 1, wherein the at least one inner spacer includes a polymer.

6. The integrated device of claim 1, further comprising an outer spacer comprising an outer spacer void.

7. The integrated device of claim 1,
wherein the first source and the first drain, each includes N type dopant (N+), and
wherein the first transistor is configured to operate as a negative channel metal oxide semiconductor (NMOS) transistor.

8. The integrated device of claim 1,
wherein the first source and the first drain, each includes P type dopant (P+), and
wherein the first transistor is configured to operate as a positive channel metal oxide semiconductor (PMOS) transistor.

9. The integrated device of claim 1, further comprising a second transistor formed over the substrate, the second transistor comprising:
a second source disposed over the substrate;
a second drain disposed over the substrate;
a second plurality of channels coupled to the second source and the second drain, wherein the second plurality of channels is located between the second source and the second drain;
at least one inner spacer located between two adjacent channels from the second plurality of channels;
at least two voids located between the two adjacent channels from the second plurality of channels; and
a second gate surrounding the second plurality of channels.

10. The integrated device of claim 9, wherein the first gate and the second gate are part of a same gate.

11. The integrated device of claim 1, wherein the at least one inner spacer comprises:
at least one source side inner spacer located between the first source and the first gate; and
at least one drain side inner spacer located between the first drain and the first gate; and
wherein the at least two voids comprises:
at least two source side voids located between the first source and the first gate, wherein the at least two source side voids touch the first source; and
at least two drain side voids located between the first drain and the first gate, wherein the at least two drain side voids touch the first drain.

12. The integrated device of claim 1, wherein the integrated device is incorporated into an electronic device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

13. An apparatus comprising:
a substrate; and
means for first transistor formed over the substrate, the means for first transistor comprising:
means for first source disposed over the substrate;
means for first drain disposed over the substrate;
means for first channeling coupled to the means for first source and the means for first drain, wherein the means for first channeling is located between the means for first source and the means for first drain;
means for first inner spacing located between two adjacent channels from the means for first channeling;
at least two voids located between the two adjacent channels from the means for first channeling, wherein the at least two voids touch the means for first drain;
means for first source side inner spacing located between a first channel and the substrate, wherein the first channel is a channel from the means for first channeling that is closest to the substrate;
at least two rows of source side voids located between the first channel and the substrate, wherein the at least two rows of source side voids touch the means for first source;
means for first drain side inner spacing located between the first channel and the sub state;
at least two rows of drain side voids located between the first channel and the substrate, wherein the at least two rows of drain side voids touch the means for first drain; and
means for first gate surrounding the means for first channeling.

14. The apparatus of claim 13, wherein the means for first inner spacing and the at least two voids are formed by alternating the means for first inner spacing and voids between the two adjacent channels.

15. The apparatus of claim 13, further comprising means for control layering between the means for first gate and the means for first inner spacing, wherein the at least two voids touch the means for control layering.

16. The apparatus of claim 13, wherein the means for first inner spacing include polymer.

17. The apparatus of claim 13, further comprising means for outer spacing comprising an outer spacer void.

18. The apparatus of claim 13, further comprising means for second transistor formed over the substrate, the means for second transistor comprising:
means for second source disposed over the substrate;
means for second drain disposed over the substrate;
means for second channeling coupled to the means for second source and the means for second drain, wherein the means for second channeling is located between the means for second source and the means for second drain;
means for second inner spacing located between two adjacent channels from the means for second channeling;
at least two voids located between two adjacent channels from the means for second channeling; and
means for second gate surrounding the means for second channeling.

19. The apparatus of claim 13,
wherein the means for first inner spacing located between two adjacent channels from the means for first channeling comprises:
at least one source side inner spacer located between the means for first source and the means for first gate; and
at least one drain side inner spacer located between the means for first drain and the means for first gate; and
wherein the at least two voids comprises:
at least two source side voids located between the means for first source and the means for first gate, wherein the at least two source side voids touch the means for first source; and
at least two drain side voids located between the means for first drain and the means for first gate, wherein the at least two drain side voids touch the means for first drain.

20. The apparatus of claim 13, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

21. An integrated device comprising:
a substrate; and
a first transistor formed over the substrate, the first transistor comprising:
a first source disposed over the substrate;
a first drain disposed over the substrate;
a first plurality of channels coupled to the first source and the first drain, wherein the first plurality of channels is located between the first source and the first drain;
at least one inner spacer located between a first channel and the substrate, wherein the first channel is a channel from the first plurality of channels that is closest to the substrate;
at least two voids located between the first channel and the substrate,
wherein the at least two voids include at least two rows of voids , and
wherein the at least two rows of voids touch the first source; and
a first gate surrounding the first plurality of channels.

22. The integrated device of claim 21, wherein the at least one inner spacer and the at least two voids are formed by alternating the at least one inner spacer and voids between the first channel and the substrate.

23. The integrated device of claim 21, further comprising a control layer between the first gate and the at least one inner spacer, wherein the at least two rows of voids extend between the control layer and the first source.

24. The integrated device of claim 21, wherein the first plurality of channels includes silicon (Si) or silicon germanium (SiGe).

25. A method for fabricating an integrated device, comprising:
providing a substrate; and
forming a first transistor over the substrate, wherein forming the first transistor comprises:
forming a first plurality of channels;
forming at least one source side inner spacer between a first channel and the substrate, such that there are at least two rows of source side voids located between the first channel and the substrate, wherein the first channel is a channel from the first plurality of channels that is closest to the substrate;

forming at least one inner spacer between two adjacent channels from the first plurality of channels, such that there are at least two voids between the two adjacent channels from the first plurality of channels;

forming a first source over the substrate, wherein the first source is formed such that the first source is touching the at least two voids and the at least two rows of source side voids;

forming a first drain over the substrate; and forming a first gate surrounding the first plurality of channels.

26. The method of claim 25, wherein the at least one inner spacer and the at least two voids are formed by alternating the at least one inner spacer and voids between the two adjacent channels.

27. The method of claim 25, further comprising forming a control layer between the first gate and the at least one inner spacer.

28. The method of claim 25, wherein each inner spacer has a thickness in a range of approximately 1-2 nanometers (nm).

29. The method of claim 25, wherein the at least one inner spacer includes polymer.

30. The method of claim 25, further comprising forming an outer spacer comprising an outer spacer void.

* * * * *